(12) United States Patent
Aibara

(10) Patent No.: US 9,686,494 B2
(45) Date of Patent: Jun. 20, 2017

(54) SEMICONDUCTOR DEVICE, RAMP SIGNAL CONTROL METHOD, IMAGE DATA GENERATING METHOD, AND CAMERA SYSTEM

(71) Applicant: Renesas Electronics Corporation, Kawasaki-shi, Kanagawa (JP)

(72) Inventor: Yasutoshi Aibara, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/753,497

(22) Filed: Jun. 29, 2015

(65) Prior Publication Data

US 2016/0021323 A1    Jan. 21, 2016

(30) Foreign Application Priority Data

Jul. 17, 2014 (JP) .................................. 2014-146988

(51) Int. Cl.

| | |
|---|---|
| *H04N 5/378* | (2011.01) |
| *H04N 5/243* | (2006.01) |
| *H03K 4/502* | (2006.01) |
| *H04N 5/235* | (2006.01) |
| *H04N 5/374* | (2011.01) |

(52) U.S. Cl.
CPC ............ *H04N 5/378* (2013.01); *H03K 4/502* (2013.01); *H04N 5/2355* (2013.01); *H04N 5/243* (2013.01); *H04N 5/3742* (2013.01)

(58) Field of Classification Search
None
See application file for complete search history.

(56) References Cited

U.S. PATENT DOCUMENTS

| 7,907,079 | B1 * | 3/2011 | Galloway | H03M 1/1014 341/155 |
|---|---|---|---|---|
| 2002/0067303 | A1 * | 6/2002 | Lee | H04N 3/155 341/184 |
| 2006/0164277 | A1 * | 7/2006 | Lee | G06J 1/00 341/155 |
| 2007/0194962 | A1 * | 8/2007 | Asayama | H03M 1/1014 341/144 |
| 2011/0114827 | A1 * | 5/2011 | Yamaoka | H03K 4/026 250/214 R |
| 2011/0121161 | A1 * | 5/2011 | Itzhak | H04N 5/378 250/208.1 |
| 2012/0194722 | A1 * | 8/2012 | Wang | H04N 5/3532 348/308 |
| 2015/0042856 | A1 * | 2/2015 | Nakamura | H04N 5/378 348/297 |

FOREIGN PATENT DOCUMENTS

JP    2013-175936 A    9/2013

* cited by examiner

*Primary Examiner* — Albert Cutler
(74) *Attorney, Agent, or Firm* — Sughrue Mion, PLLC

(57) ABSTRACT

Conventional semiconductor devices disadvantageously failed to sufficiently enlarge a dynamic range. A semiconductor device according to an embodiment includes a plurality of registers 21 to 26 that sets a gradient of a ramp signal. In the semiconductor device, the values in the registers 24 to 26 that are reflected in the gradient of the ramp signal are switched at predetermined timings, whereby a ramp signal with a gradient that changes at the predetermined timings is generated, and an analog-to-digital converter uses the ramp signal to convert pixel signals acquired from a pixel area into digital values.

20 Claims, 16 Drawing Sheets

SEMICONDUCTOR DEVICE, RAMP SIGNAL CONTROL METHOD, IMAGE DATA GENERATING METHOD, AND CAMERA SYSTEM

CROSS-REFERENCE TO RELATED APPLICATIONS

This application is based upon and claims the benefit of priority from Japanese patent application No. 2014-146988, filed on Jul. 17, 2014, the disclosure of which is incorporated herein in its entirety by reference.

BACKGROUND

The present invention relates to a semiconductor device, a ramp signal control method, an image data generating method, and a camera system, and for example, to a semiconductor device having an analog-to-digital converter that utilizes a ramp signal when converting pixel signals obtained from pixels into digital values, a ramp signal control method, an image data generating method, and a camera system.

Various types of control have often been performed by image processing. To acquire images used for the image processing, a solid state image sensor such as a complementary metal oxide semiconductor (CMOS) image sensor is used. In recent years, there has been a demand to improve the quality of images acquired by the CMOS image sensor in order to increase the accuracy of the image processing. Thus, Japanese Unexamined Patent Application Publication No. 2013-175936 discloses a technique for improving the quality of images acquired by the CMOS image sensor.

In Japanese Unexamined Patent Application Publication No. 2013-175936, a ramp wave generating unit that outputs a ramp wave voltage, and an AD conversion unit that uses the ramp wave voltage to convert input analog signals corresponding to the amount of light incident on pixels into output digital signals, are provided. According to Japanese Unexamined Patent Application Publication No. 2013-175936, the ramp wave generating unit has a first current output DA conversion circuit that generates an output current according to first digital data, and an integrator that outputs a voltage corresponding to integration of a first output current as a ramp wave voltage.

SUMMARY

However, Japanese Unexamined Patent Application Publication No. 2013-175936 disadvantageously fails to provide a sufficiently wide dynamic range. Other objects and novel features will be apparent from the descriptions herein and attached drawings.

In an embodiment, a semiconductor device includes a plurality of registers that sets a gradient of a ramp signal, and switches, at predetermined timings, values in the registers that are reflected in the gradient of the ramp signal to generate the ramp signal with the gradient changing at predetermined timings, and an analog-to-digital converter uses the ramp signal to convert pixel signals acquired from a pixel region into digital values.

For example, the above-described embodiment expressed as a method or a system that replaces the embodiment is also effective as an aspect of the present invention.

According to the embodiment, the semiconductor device allows enlargement of a dynamic range of image data generated based on information obtained from pixels.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
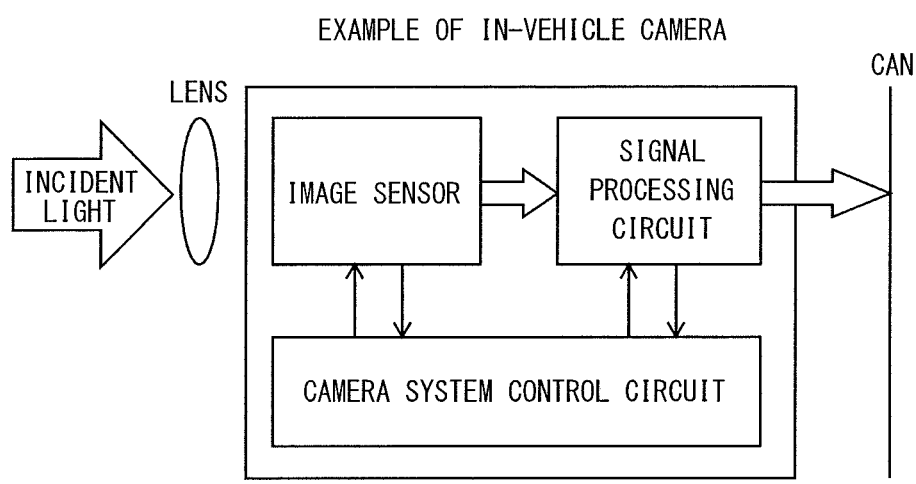
FIG. 1 is a block diagram depicting a first example of a camera system to which a semiconductor device according to Embodiment 1 is applied.

For clarification of description, the descriptions and drawings illustrated below are omitted and simplified as needed. In the drawings, the same elements are denoted by the same reference numerals and duplicate descriptions are omitted as needed.

A semiconductor device according to Embodiment 1 has a pixel area in which pixels are arranged and a peripheral circuit that converts information on charge (hereinafter referred to as pixel signals) accumulated in the pixel area into pixel information and that outputs the pixel information. A device including the pixel area and the peripheral circuit is hereinafter referred to as an imaging device. Thus, first, a camera system including the imaging device will be described.

Figure 2:
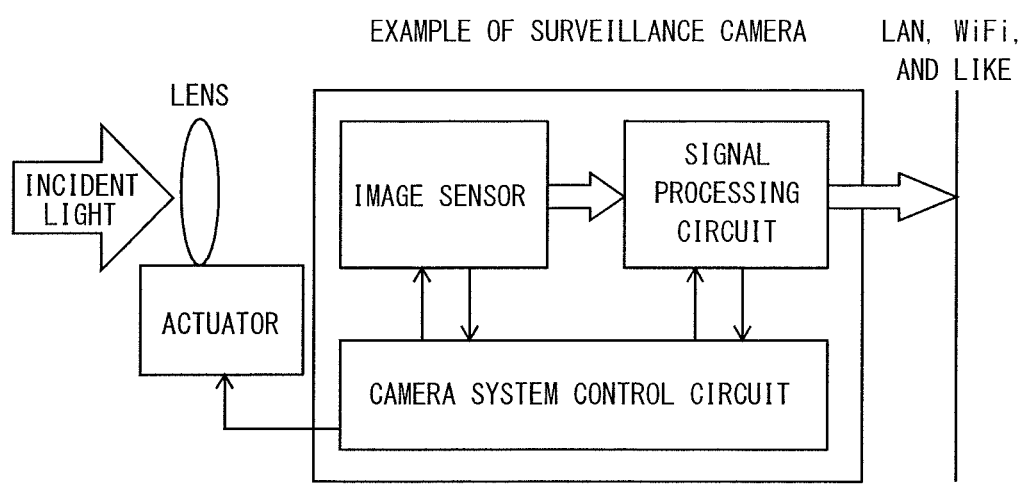
FIG. 2 is a block diagram depicting a second example of a camera system to which a semiconductor device according to Embodiment 1 is applied.

FIG. 1 and FIG. 2 depict block diagrams of an example of a camera system to which the semiconductor device according to Embodiment 1 is applied. An example of the camera system in FIG. 1 is an in-vehicle camera. An example of the camera system in FIG. 2 is a camera system in a surveillance camera. The semiconductor device according to Embodiment 1 is an imaging device depicted in FIG. 1 and FIG. 2. In the camera system, an image sensor outputs image information in accordance with incident light incident via a lens. Then, in the camera system, a signal processing circuit executes signal processing on the image information output by the image sensor and outputs information on signal processing results to a higher system connected to the signal processing circuit so as to succeed the signal processing circuit. In this regard, the signal processing circuit is connected to an in-vehicle network such as a controller area network (CAN) in in-vehicle applications and to a general-purpose network such as a local area network (LAN) in surveillance cameras.

Furthermore, in the camera system, general operations such as image taking timing and standby are controlled by a camera system control circuit. A lens often has a fixed focus in in-vehicle applications and has a variable focus in surveillance camera applications. Thus, in surveillance camera applications, an actuator that controls the focal distance of the lens is often provided.

In such in-vehicle applications or surveillance camera applications, under an image taking condition where, for example, the camera system is installed in a tunnel or in a nighttime dark environment and where images of the neighborhood of an exit of the tunnel are taken or apart of the dark environment is lighted, blown out highlights (clipped whites) or blocked up shadows (crushed shadows) may occur when the camera system does not have a wide dynamic range. Furthermore, particularly in in-vehicle applications, it is very necessary to accurately take images of dark subjects, that is, low-illuminance subjects, such as nighttime pedestrians and obstacles, and license plates of oncoming cars visible between bright headlights of the cars. Thus, in in-vehicle applications or surveillance camera applications, there has been a demand to acquire images using a dynamic range with the above-described characteristics of the applications taken into account.

Figure 3:
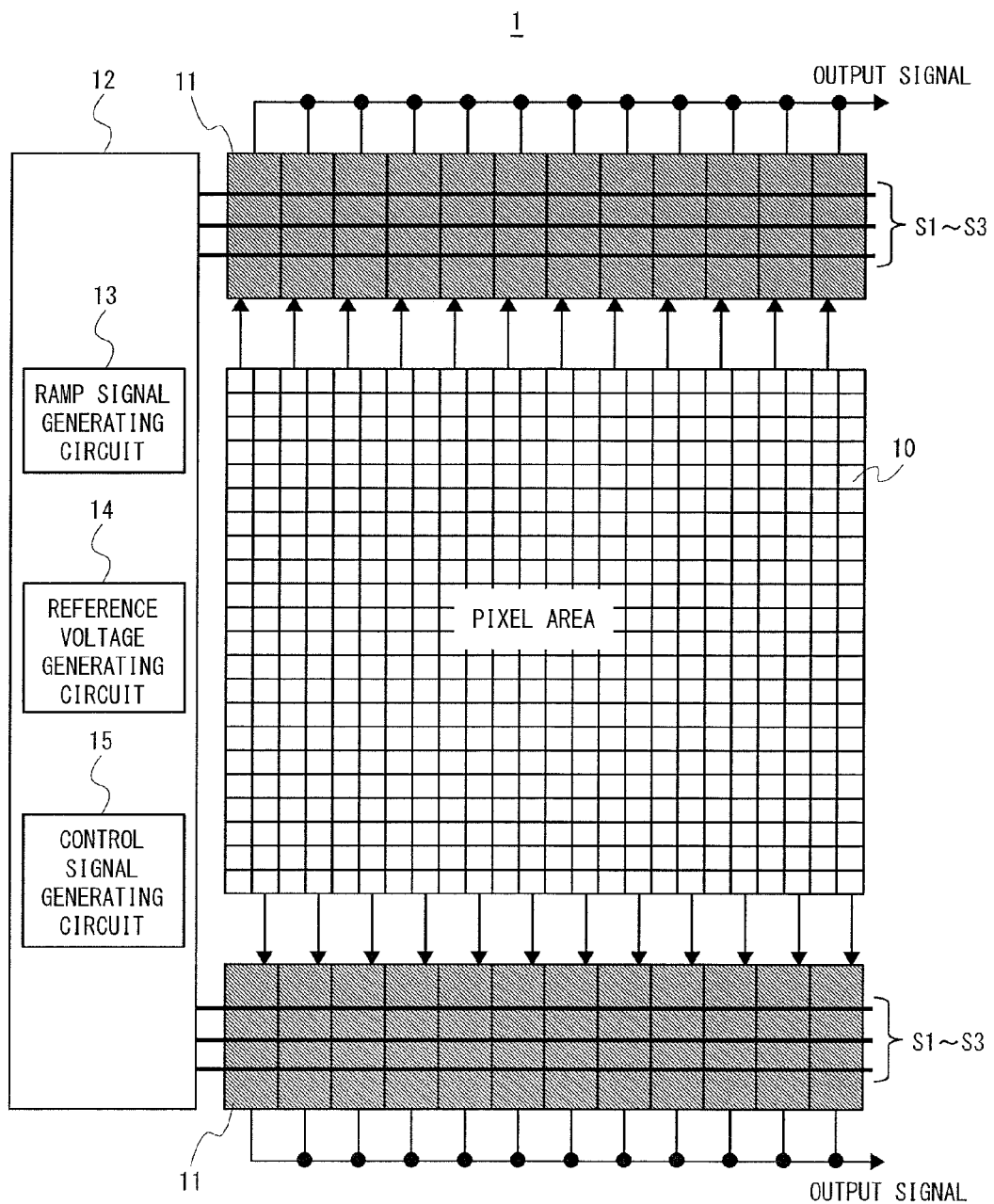
FIG. 3 is a block diagram of a semiconductor device according to Embodiment 1.

FIG. 3 depicts a block diagram of a semiconductor device 1 according to Embodiment 1. As depicted in FIG. 3, the semiconductor device 1 according to Embodiment 1 has a pixel area 10, an analog-to-digital converter 11, and a control unit 12. Furthermore, the control unit 12 has a ramp signal generating circuit 13, a reference voltage generating circuit 14, and a control signal generating circuit 15.

The pixel area 10 stores charge according to the amount of incident light to output a pixel signal. In an example illustrated in FIG. 3, pixels are formed in a matrix in the pixel area 10. Each of the pixels stores charge for one pixel in image information. Image signals obtained from the pixels are read from each column.

The analog-to-digital converter 11 reads pixel signals from the pixel area 10 and uses a ramp signal to output digital signals (output signals) according to the magnitudes of the pixel signals. The analog-to-digital converter 11 is provided for each column of the pixels in the pixel area 10. In the example depicted in FIG. 3, the analog-to-digital converters 11 corresponding to odd-numbered columns in the pixel area 10 are arranged on an upper side, in the drawing, of the pixel area 10. The analog-to-digital converters 11 corresponding to even-numbered columns in the pixel area 10 are arranged on a lower side, in the drawing, of the pixel area 10. A detailed configuration of the analog-to-digital converter 11 will be described below.

The control unit 12 outputs a ramp signal S1, a reference voltage signal S2, and an operation control signal S3 that control the analog-to-digital converter 11. In the semiconductor device 1, power supply wires and ground wires are arranged over an area where the analog-to-digital converters 11 are arranged in a direction traversing the area where the analog-to-digital converters 11 are arranged (in the direction in which the analog-to-digital converters 11 are arranged in juxtaposition); in FIG. 3, illustration of the wires is omitted. FIG. 3 depicts the ramp signal generating circuit 13, the reference voltage generating circuit 14, and the control signal generating circuit 15 as internal circuits of the control unit 12. However, the control unit 12 may include other circuits.

The ramp signal generating circuit 13 outputs the ramp signal S1 at predetermined timings. The reference voltage generating circuit 14 generates the reference voltage signal S2 utilized by the analog-to-digital converter 11, the ramp signal generating circuit 13, and the like. The control signal generating circuit 15 generates the operation control signal S3 that controls the analog-to-digital converter 11 and a control signal that controls operations of the ramp signal generating circuit 13. The ramp signal generating circuit 13 will be described below in detail.

Figure 4:
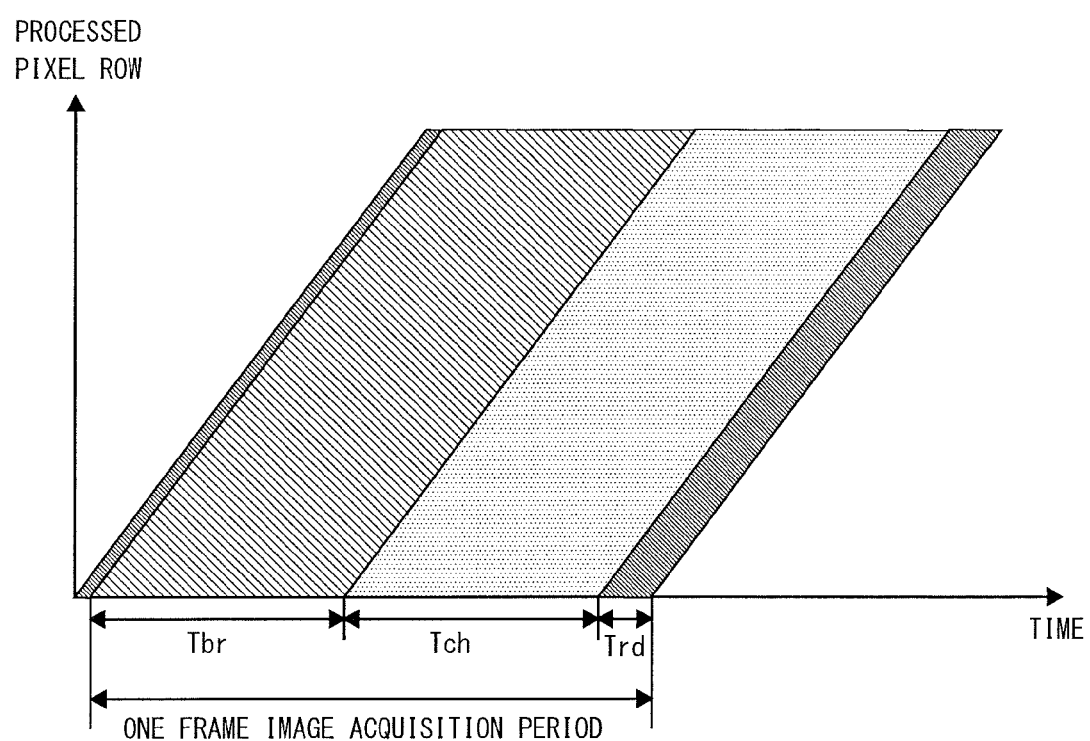
FIG. 4 is a timing chart illustrating acquisition of pixel signals in the semiconductor device according to Embodiment 1.

Now, operations of the semiconductor device 1 according to Embodiment 1 performed in acquiring pixel signals will be described. FIG. 4 depicts a timing chart illustrating acquisition of pixel signals in the semiconductor device according to Embodiment 1. As depicted in FIG. 4, in the semiconductor device according to Embodiment 1, an image for one frame is acquired through three operation periods, a blanking period Tbr, an exposure period Tch, and a read period Trd. The blanking period Tbr is a period used to adjust the length of the exposure period Tch and to reset the charge in pixels. The exposure period Tch is a period when the pixels are actually exposed to incident light and when charge according to the amount of the incident light is accumulated in the pixels. The read period Trd is a period when pixel signals indicating the amount of charge accumulated in the pixels are read out to the analog-to-digital converter 11. During the read period Trd, the analog-to-digital converter 11 converts the pixel signals that are analog signals into image information that is digital values. Furthermore, as depicted in FIG. 4, the semiconductor device 1 uses a rolling shutter scheme in which sequential processing is executed on pixel rows, and thus, for example, processing on rows far from the analog-to-digital converter 11 is executed at a later timing than processing on rows close to the analog-to-digital converter 11. Consequently, when the axis of ordinate represents a pixel row to be processed and the axis of abscissas represents time, then in a timing chart, each period is expressed by a rhombic shape formed of processing timings.

Figure 5:
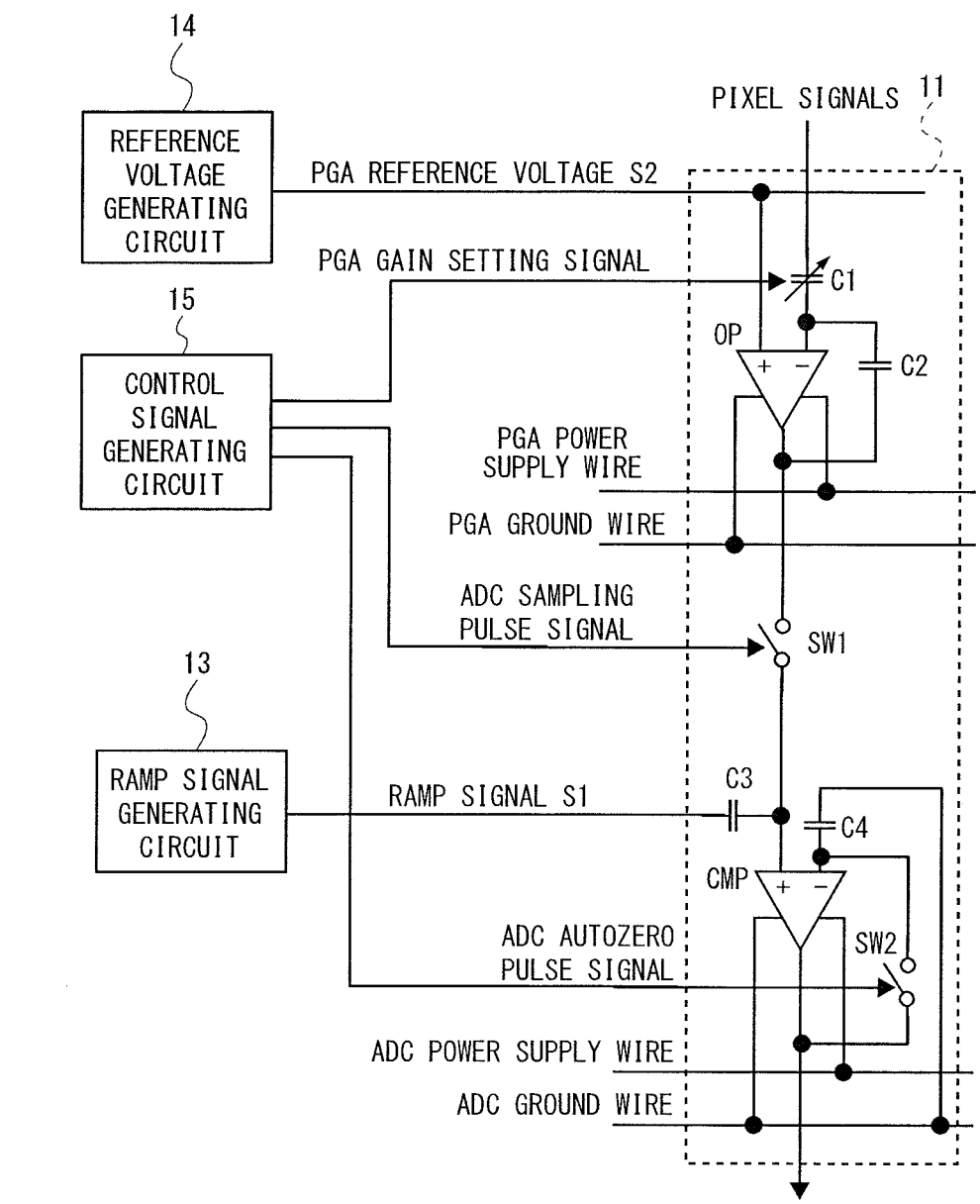
FIG. 5 is a block diagram of an analog-to-digital converter and a control unit in the semiconductor device according to Embodiment 1.

Now, details of the analog-to-digital converter 11 will be described. FIG. 5 depicts a block diagram of the analog-to-digital converter 11 and the control unit 12 in the semiconductor device 1 according to Embodiment 1. As depicted in FIG. 5, the analog-to-digital converter 11 has an amplifier OP, a comparator CMP, capacitors C1 to C4, and switches SW1 and SW2. A programmable gain amplifier (PGA) gain setting signal, an analog to digital converter (ADC) sampling pulse signal, and an ADC auto zero pulse signal are signals included in the operation control signal S3.

The amplifier OP receives pixel signals at an inverted input terminal via the capacitor C1. The capacitor C2 is provided between an output terminal and an output terminal of the amplifier OP. A non-inverted input terminal of the amplifier OP is provided with a PGA reference voltage from the reference voltage generating circuit 14. The capacitor C1 is a variable capacitance with a capacitance value determined by a PGA gain setting signal output by the control signal generating circuit 15. The amplifier OP and the capacitors C1 and C2 function as a programmable gain amplifier. The programmable gain amplifier uses the PGA gain setting signal to change the capacitance ratio between the capacitors C1 and C2, thereby varying an amplification rate for the pixel signals.

The capacitor C4 is connected between an inverted input terminal of the comparator CMP and the ground wire, and a non-inverted input terminal of the comparator CMP is connected to an output terminal of the amplifier OP via a switch SW1. A first end of the capacitor C3 is connected to a non-inverted input terminal of the comparator CMP. The ramp signal S1 from the ramp signal generating circuit 13 is input to a second end of the capacitor C3. Furthermore, the switch SW2 is connected between the inverted input terminal and output terminal of the comparator CMP. The switch SW1 has its open and close state controlled by an ADC sampling pulse signal output by the control signal generating circuit 15. The switch SW2 has its open and close state controlled by an ADC autozero pulse signal. The analog-to-digital converter 11 has a counter that counts a reference clock or the like in accordance with an output value from the comparator CMP; in FIG. 5, illustration of the counter is omitted.

In this regard, the comparator CMP and the capacitors C3 and C4 function as a single slope integration AD conversion circuit. The single slope integration AD conversion circuit references the ramp signal S1 having a correlation with the count value in the counter that counts the output value from the comparator CMP. The single slope integration AD conversion circuit inputs the ramp signal S1 to the comparator CMP, compares an analog signal to be converted with the ramp signal S1, holds the count value obtained when the analog signal matches the ramp signal S1, and outputs the count value as an AD conversion result. In the example depicted in FIG. 5, the analog levels of pixel signals are held which are input from a program gain amplifier side to the capacitors C3 and C4. The single slope integration AD conversion circuit according to Embodiment 1 compares voltages resulting from charge accumulated in the two capacitors while changing the voltage level of the ramp signal S1 provided to the second end of the capacitor C3.

In order to maximize the performance of the analog-to-digital converter 11 and to suppress a decrease in S/N caused by quantization noise, the analog-to-digital converter 11 needs to perform, in a stage before the comparator CMP, analog gain control that amplifies a pixel signal to be converted to an optimum level for the dynamic range of the comparator CMP. Furthermore, the semiconductor device 1 according to Embodiment 1 changes the maximum voltage and gradient of the ramp signal S1 output by the ramp signal generating circuit 13 to change the resolution of the analog-to-digital converter 11 with respect to the signal level of the pixel signal.

Figure 6:
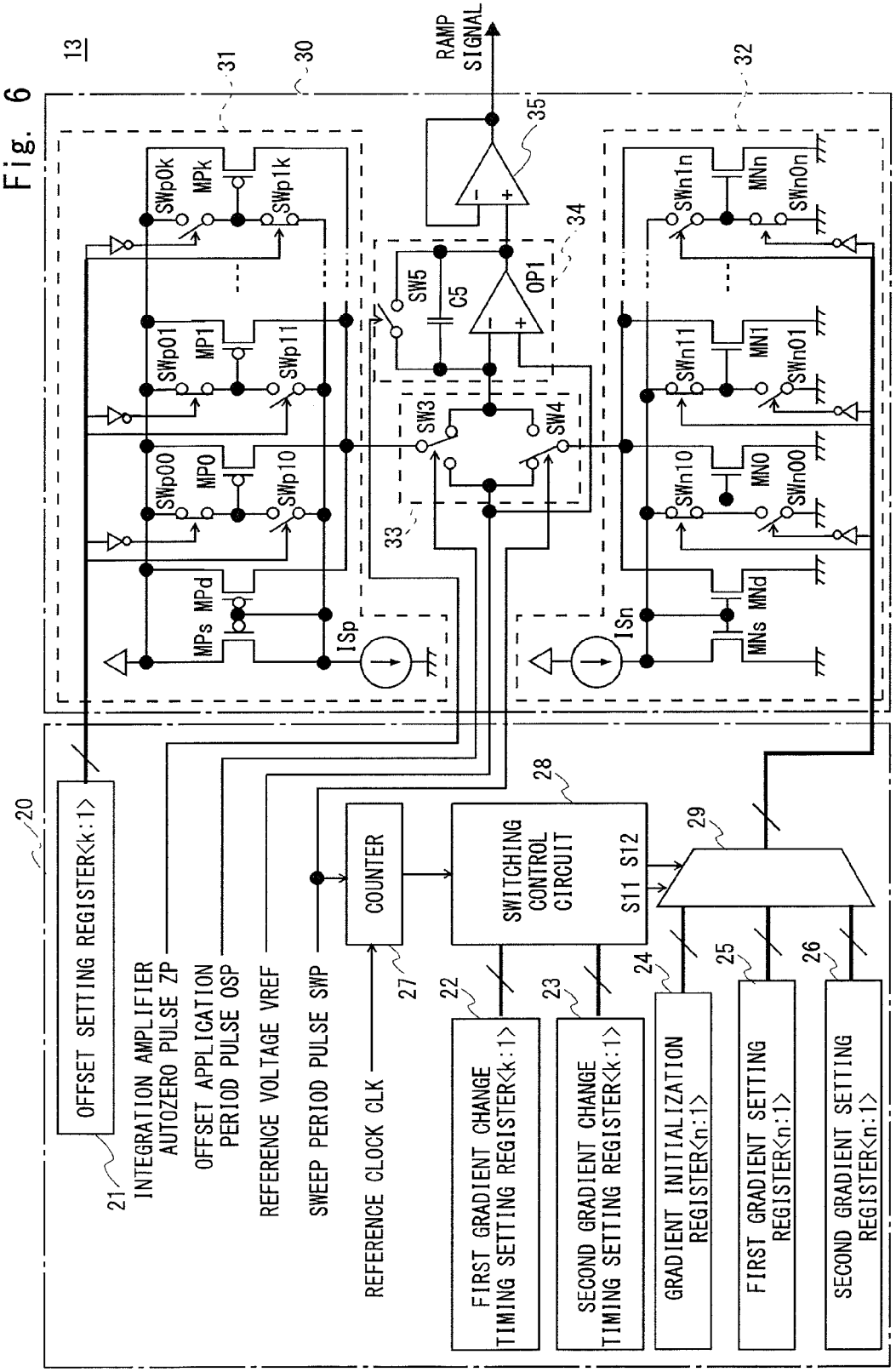
FIG. 6 is a block diagram of a ramp signal generating circuit in the semiconductor device according to Embodiment 1.
Figure 14:
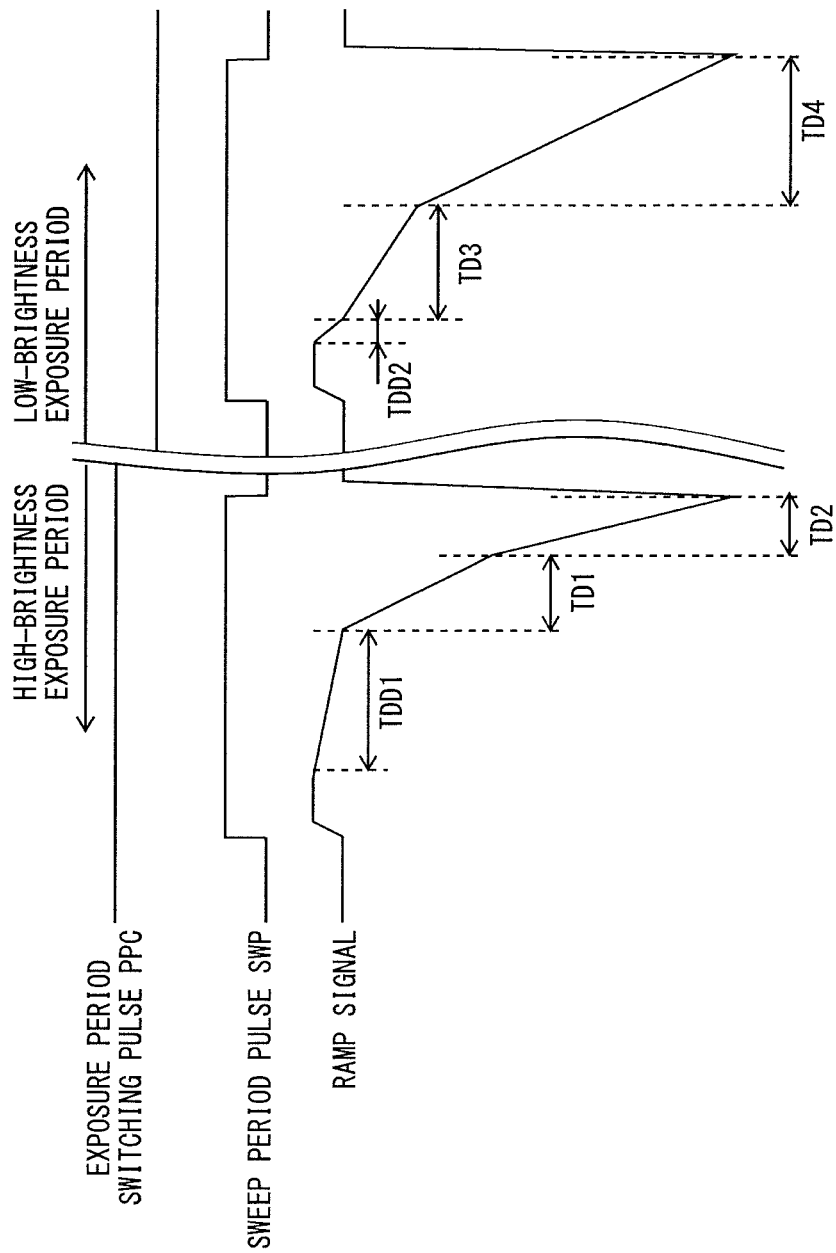
FIG. 14 is a timing chart illustrating a variation in ramp signal in the semiconductor device according to Embodiment 3.

Thus, a detailed configuration of the ramp signal generating circuit 13 will be described below. FIG. 6 depicts a block diagram of the ramp signal generating circuit 13 according to Embodiment 1. As depicted in FIG. 14, the ramp signal generating circuit 13 has a ramp waveform control unit 20 and a ramp waveform generating circuit 30.

The ramp waveform control unit 20 sets a ramp waveform determined by a target voltage and a reference voltage for the ramp signal S1 and the gradient of the ramp signal S1 and switches a set value for the ramp signal S1 during a sweep period when the waveform of the ramp signal S1 is changed. More specifically, the ramp signal generating circuit 13 has an initial gradient period, a first gradient period, and a second gradient period during the sweep period, and varies the gradient of the ramp signal S1 during each of the periods. The ramp waveform control unit 20 has an offset setting register 21, a first gradient change timing register 22, a second gradient change timing register 23, a gradient initialization register 24, a first gradient setting register 25, a second gradient setting register 26, a counter 27, a switching control circuit 28, and a selector 29. In this regard, the gradient refers to the absolute value of the ratio of voltage to time.

The offset setting register 21 stores an offset setting value for setting a voltage value for the initial ramp signal S1 during the initial gradient period. The first gradient change timing register 22 stores a first change timing value indicating a change timing for a change from the initial gradient period to the first gradient period. The second gradient change timing register 23 stores a second change timing value indicating a change timing for a change from the first gradient period to the second gradient period. The gradient initialization register 24 stores an initial gradient setting value indicating the gradient of the ramp signal S1 during the initial gradient period. The first gradient setting register 25 stores a first gradient setting value indicating the gradient of the ramp signal S1 during the first gradient period. The second gradient setting register 26 stores a second gradient setting value indicating the gradient of the ramp signal S1 during the second gradient period.

The initial gradient setting value, the first gradient setting value, and the second gradient setting value are each an n-bit value and take $2^n$ values. Furthermore, the offset setting value, the first gradient change timing value, and the second gradient change timing value are each a k-bit value and take $2^k$ values. In this case, n and k are integers and may have the same value. The present embodiment illustrates an example where the number of changes in the gradient of the ramp signal is set to two. However, the number of changes may be one or at least three.

The counter 27 counts the number of clocks in a reference clock CLK received during a period when a sweep period pulse SWP is in an enabled state (for example, a high level) indicating the sweep period, and outputs the count value. The switching control circuit 28 compares the count value with the first change timing value and compares the count value with the second change timing value to output a select signal S11 or S12 according to the period. The selector 29 outputs any one of the initial gradient value, the first gradient setting value, and the second gradient change timing value in accordance with the select signal S11 or S12.

The ramp waveform generating circuit 30 generates a setting value provided by the ramp waveform control unit 20 to generate a ramp signal. The ramp waveform generating circuit 30 has an offset current source 31, a current digital-analog conversion circuit 32, a waveform switching circuit 33, an integration circuit 34, and a buffer circuit 35.

The offset current source 31 outputs an offset current to the integration circuit 34 in accordance with the offset setting value. The offset current source 31 switches the mirror ratio of a current mirror circuit in accordance with the offset setting value to vary the current value of the offset current. More specifically, the offset current source 31 has a current source ISp, PMOS transistors MPs, MPd, and MP0 to MPk (k at the end of MPk is indicative of an integer and is the same value as that of the number of bits in the offset setting value), and switches SWp00 to SWp0k, and SWp10 to SWp1k (k at the end of SWp0k and SWpk is indicative of an integer and is the same value as that of the number of bits in the offset setting value).

The offset current source 31 has a current mirror circuit in which the PMOS transistor MPs serves as a source side transistor and in which the PMOS transistors MPd and MP0 to MPn serve as branch side transistors. For the PMOS transistors MPs, MPd, and MP0 to MPk, a source is connected to the power supply wire. A drain of the PMOS transistor MPs is provided with a reference current from the current source ISp. Gates of the PMOS transistors MPs and MPd are connected together. Furthermore, the drain of the PMOS transistor MPs is connected to the gate of the PMOS transistor MPs and to the gate of the PMOS transistor MPd. The switches SWp00 to SWp0k are provided between the power supply wire and the gates of the respective PMOS transistors MP0 to MPk. Furthermore, the switches SWp10 to SWp1k are provided between the gate of the PMOS transistor MPs and the gates of the PMOS transistors MP0 to MPk. The switches SWp00 to SWp0k and the switches SWp10 to SWp1k each have its open and close state controlled in accordance with the value of a corresponding bit in the offset setting value. Additionally, the switches SWp00 to SWp0k and the switches SWp10 to SWp1k are controlled such that the open and close states of the switches are exclusive based on the value of the corresponding bit in the offset setting value. In other words, the offset current source 31 is controlled such that the number of branch side transistors in the current mirror circuit that output output currents is set to any one of the values between 1 and k+1, to enable the current value of the offset current to be switched in $2^k$ steps.

For the variable range of an output current from the current digital-analog conversion circuit 32, the mirror ratio of the current mirror circuit is set such that, when the output current serving as a reference is set to 1, for example, the output current can be varied within a given change range from quarter to four times. The mirror ratio is set such that the output current from the current digital-analog conversion circuit 32 can be varied in $2^n$ steps.

The current digital-analog conversion circuit 32 outputs the output current with a magnitude according to a value output by the selector 29. The setting value output by the selector 29 is an n-bit value, and thus, the current digital-analog conversion circuit 32 can switch the current value of the output current in $2^n$ steps. The current digital-analog conversion circuit 32 has a current source ISn, NMOS transistors MNs, MNd, and MN0 to MNn (n at the end of MNn is indicative of an integer and is the same value as that of the number of bits in the setting value output by the selector 29), and switches SWn00 to SWn0n, and SWn10 to SWn1n (n at the end of SWn0n and SWn1n is indicative of an integer and is the same value as that of the number of bits in the setting value output by the selector 29).

The current digital-analog conversion circuit 32 has a current mirror circuit in which the NMOS transistor MNs serves as a source side transistor and in which the NMOS transistors MNd and MN0 to MNn serve as branch side transistors. For the NMOS transistors MNs, MNd, and MN0 to MNn, a source is connected to the ground wire. A drain of the NMOS transistor MNs is provided with a reference current from the current source ISn. Gates of the NMOS transistors MNs and MNd are connected together. Furthermore, the drain of the NMOS transistor MNs is connected to the gate of the NMOS transistor MNs and to the gate of the NMOS transistor MNd. The switches SWn00 to SWn0n are provided between the ground wire and the gates of the respective NMOS transistors MN0 to MNn. Furthermore, the switches SWN10 to SWN1n are provided between the gate of the NMOS transistor MNs and the gates of the NMOS transistors MN0 to MNn. The switches SWn00 to SWn0n and the switches SWn10 to SWn1n each have its open and close state controlled in accordance with the value of a corresponding bit in the setting value output by the selector 29. Additionally, the switches SWn00 to SWn0n and the switches SWn10 to SWn1n are controlled such that the open and close states of the switches are exclusive based on the value of the corresponding bit in the setting value output by the selector 29. In other words, the current digital-analog conversion circuit 32 is controlled such that the number of branch side transistors in the current mirror circuit that output output currents is set to any one of the values between 1 and n+1, to enable the current value of the output current to be switched in $2^n$ steps.

The waveform switching circuit 33 determines, in a switching manner, whether to provide the integration circuit 34 with the offset current output by the offset current source 31 or the output current output by the current digital-analog conversion circuit 32. The waveform switching circuit 33 has switches SW3 and SW4. The switch SW3 determines, in a switching manner, whether to pass the offset current to the integration circuit 34 side or to a terminal to which a reference voltage VREF is input. The switch SW4 determines, in a switching manner, whether to pass the output current to the integration circuit 34 side or to a terminal to which the reference voltage VREF is input. The switch SW3 switches a path using an offset application period pulse OSP. The switch SW4 switches a path using a sweep period pulse SWP. The reference voltage VREF is provided by the reference voltage generating circuit 14. Additionally, the offset application period pulse OSP and the sweep period pulse SWP are provided by the control signal generating circuit 15.

The integration circuit 34 integrates output currents to output the ramp signal S1. Furthermore, upon receiving the offset current, the integration circuit 34 integrates the offset current to set the voltage level of the ramp signal S1 to an offset level. The ramp signal output by the integration circuit 34 is provided to the analog-to-digital converter 11 via the buffer circuit 35.

The integration circuit 34 has an amplifier OP1, a capacitor C5, and a switch SW5. The reference voltage VREF is input to a non-inverted input terminal of the amplifier OP1. The offset current or the output current is input to a non-inverted input terminal of the amplifier OP1 via the waveform switching circuit 33. The capacitor C5 and the switch SW5 are connected in parallel between an inverted input terminal and an output terminal of the amplifier OP1. The integration circuit 34 changes the voltage of the output ramp signal S1 based on the integral value of the output current or the offset current, using the reference voltage VREF as a reference voltage. The switch S5 has its open and close state controlled based on an integration amplifier autozero pulse ZP output by the control signal generating circuit 15.

Figure 7:
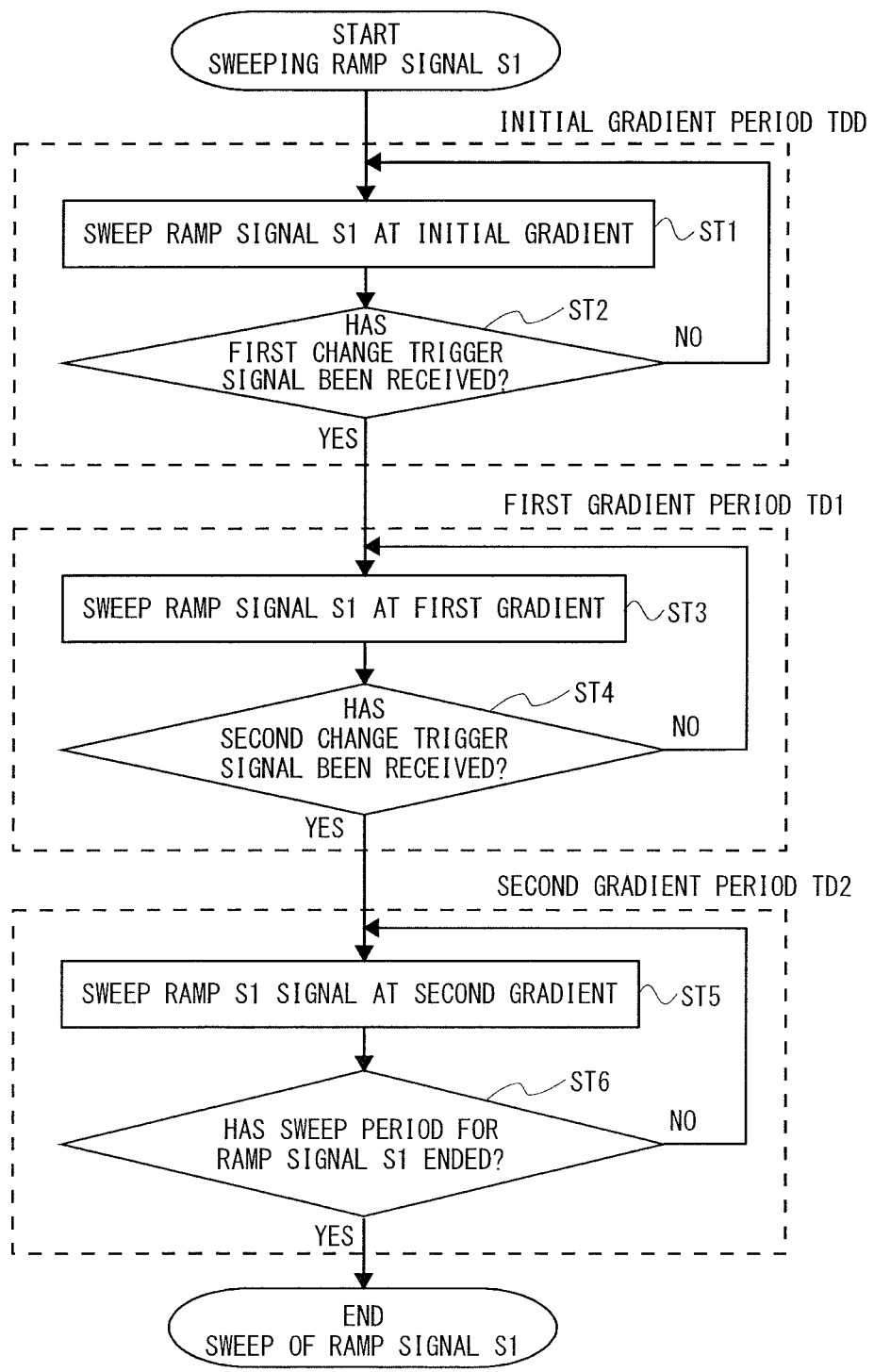
FIG. 7 is a flowchart of a method for generating a ramp signal in the semiconductor device according to Embodiment 1.

Subsequently, operations of the ramp signal generating circuit 13 according to Embodiment 1 will be described. First, a method for generating the ramp signal S1 in the semiconductor device 1 according to Embodiment 1. FIG. 7 depicts a flowchart of a method for generating the ramp signal S1 in the semiconductor device 1 according to Embodiment 1.

As depicted in FIG. 7, in the semiconductor device 1 according to Embodiment 1, when sweeping of the ramp signal S1 is started, first, the ramp signal S1 is swept in accordance with the initial gradient setting value (step ST1). Then, the sweeping of the ramp signal S1 at the initial gradient is continued until a first change trigger signal is received (step ST2). The first change trigger signal is a signal generated in the switching control circuit 28 in response to the arrival, at a first change timing value, of the count value output by the counter 27, and is transmitted and received inside the switching control circuit 28.

Then, in response to determination of reception of the first change trigger signal in step ST2, the semiconductor device 1 according to Embodiment 1 changes the gradient of the ramp signal S1 to a first gradient in accordance with a first gradient setting value (step ST3). The sweeping of the ramp signal S1 at the first gradient is continued until a second change trigger signal is received (step ST4). The second change trigger signal is a signal generated in the switching control circuit 28 in response to the arrival, at a second change timing value, of the count value output by the counter 27, and is transmitted and received inside the switching control circuit 28.

Then, in response to determination of reception of the second change trigger signal in step ST4, the semiconductor device 1 according to Embodiment 1 changes the gradient of the ramp signal S1 to a second gradient in accordance with a second gradient setting value (step ST5). The sweeping of the ramp signal S1 at the second gradient is continued until the sweep period ends (step ST6).

Figure 8:
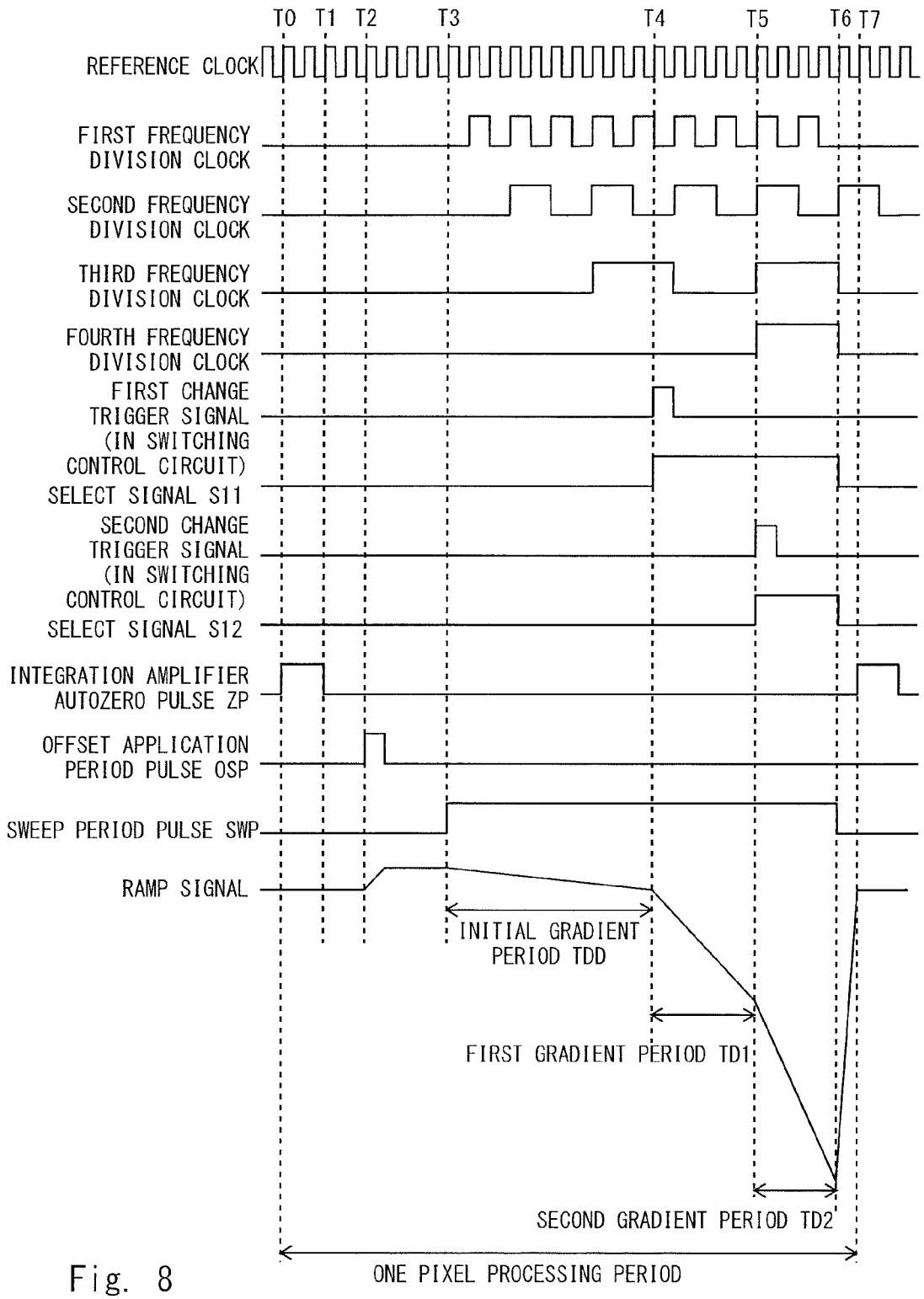
FIG. 8 is a timing chart illustrating operations of the ramp signal generating circuit according to Embodiment 1.

FIG. 8 depicts a timing chart illustrating operations of the ramp signal generating circuit 13 according to Embodiment 1. By way of example, FIG. 8 depicts a first frequency division clock generated inside the counter 27. A value represented by a set of the first to a fourth frequency division clocks is the count value. Furthermore, FIG. 8 depicts the first change trigger signal and second change trigger signal used in the switching control circuit 28. The timing chart depicted in FIG. 8 illustrates an example where a period of ramp signal S1 is generated using a small number of reference clocks CLK for concise description of operations of the ramp signal generating circuit 13. However, in actuality, one pixel processing period contains more reference clocks. Additionally, the number of frequency division clocks from the counter 27 is larger than in the example illustrated in FIG. 8.

As depicted in FIG. 8, the ramp signal generating circuit 13 generates a period of ramp signal S1 for every period in which one pixel of pixel signal is processed. FIG. 8 depicts a processing period for one pixel as one pixel processing period. When a pixel processing period is started at timing T0, first, the integration amplifier autozero pulse shifts from a low level to a high level during timings T10 to T1. Thus, the charge accumulated in the capacitor C5 in the integration circuit 34 is reset to zero.

Then, at timing T2, the offset application period pulse OSP shifts from the low level to the high level. In the example depicted in FIG. 8, the offset application period pulse OSP remains at the high level during one period of the reference clock CLK. While the offset application period pulse OSP is at the high level, the offset current source 31 applies the offset current to the integration circuit 34. Thus, the voltage level of the ramp signal S1 rises. Furthermore, the ramp signal S1 rises during the period in which the offset application period pulse OSP is at the high level, and is kept at the risen voltage after the offset application period pulse OSP has shifted to the low level.

Then, at timing T3, the sweep period pulse SWP shifts from the low level to the high level. Consequently, the counter 27 starts counting. Furthermore, in response to shifting of the sweep period pulse SWP to the high level, the integration circuit 34 is provided with an output current. In the ramp signal generating circuit 13 according to Embodiment 1, the current digital-analog conversion circuit 32 outputs the output current in a direction in which current is drawn out from the integration circuit 34. Thus, the voltage of the ramp signal S1 starts to lower at timing T3. During the initial gradient period TDD from timing T3 to timing T4, the count value in the counter 27 fails to reach the first gradient change timing value. Accordingly, the switching control circuit 28 allows the selector 29 to select the initial gradient setting value. Consequently, during the initial gradient period TDD from timing T3 to timing T4, the gradient of the ramp signal S1 corresponds to the initial gradient setting value.

Then, when the counter value in the counter 27 reaches the first gradient change timing value at timing T4, the first change trigger signal shifts to the high level in the switching control circuit 28. The switching control circuit 28 switches the select signal S11 to the high level in accordance with a rising edge of the first change trigger signal. Thus, the selector 29 switches the selected setting value to the first gradient setting value. In the example depicted in FIG. 8, the first gradient setting value is larger than the initial gradient setting value. Consequently, at timing T4, the gradient of the ramp signal S1 is steeper than the gradient during the initial gradient period TDD. Furthermore, a period between timing T4 and timing T5 when the gradient of the ramp signal S1 is changed is hereinafter referred to as a first gradient period TD1.

Then, when the count value in the counter 27 reaches the second gradient change timing value at timing T5, the second change trigger signal shifts to the high level in the switching control circuit 28. The switching control circuit 28 switches the select signal S12 to the high level in accordance with a rising edge of the second change trigger signal. Thus, the selector 29 switches the selected setting value to the second gradient setting value. In the example depicted in FIG. 8, the second gradient setting value is larger than the first gradient setting value. Consequently, at timing T5, the gradient of the ramp signal S1 is steeper than the gradient during the first gradient period TD1. Furthermore, a period starting at timing T5 and while the gradient of the ramp signal S1 is kept so as to correspond to the second gradient setting value is hereinafter referred to as a second gradient period TD2.

Then, when the sweep period pulse SWP shifts from the high level to the low level at timing T6, the current digital-analog conversion circuit 32 stops application of the output current to the integration circuit 34. Thus, the change in the voltage of the ramp signal S1 is stopped. A period from timing T3 to timing T6 is hereinafter referred to as the sweep period.

Subsequently, when the integration amplifier autozero pulse ZP shifts to the high level at timing T7, the charge accumulated in the capacitor C5 in the integration circuit 34 is reset to recover the voltage of the ramp signal S1 to the initial state. Timing T7 corresponds to a start timing for the next one pixel processing period. Furthermore, each pulse period is an example, and the number of clocks is optional.

Figure 9:
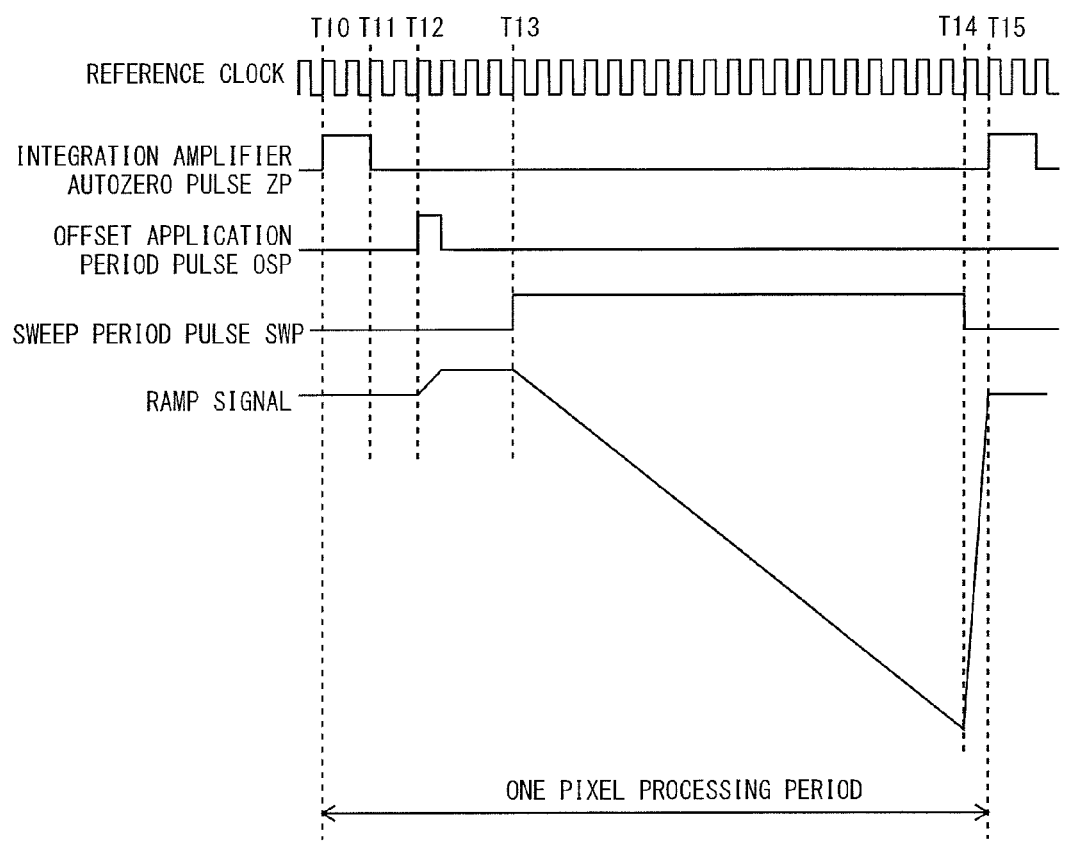
FIG. 9 is a timing chart illustrating operations of a ramp wave generating circuit according to a comparative example.

Changes in the ramp signal in a case where the ramp signal generating circuit 13 not having the ramp waveform control unit 20 is used will be described as a comparative example. FIG. 9 depicts a timing chart illustrating operations of a ramp wave generating circuit according to the comparative example. As depicted in FIG. 9, also in the ramp signal generating circuit according to the comparative example, the voltage level of the ramp signal changes as is the case with the ramp signal generating circuit 13 corresponding to Embodiment 1, during timings T10 to T13 corresponding to timings T0 to T3 in FIG. 8. Then, at timing T13 and later, the ramp signal generating circuit according to the comparative example changes the voltage of the ramp signal such that the voltage lowers linearly, while avoiding changing the gradient. The timings illustrated in the above description are an example, and a pulse width, that is, the number of clocks can be optionally set. Furthermore, the description is based on the waveform of the lowering voltage. However, the description also applies to a waveform of a rising voltage.

Figure 10:
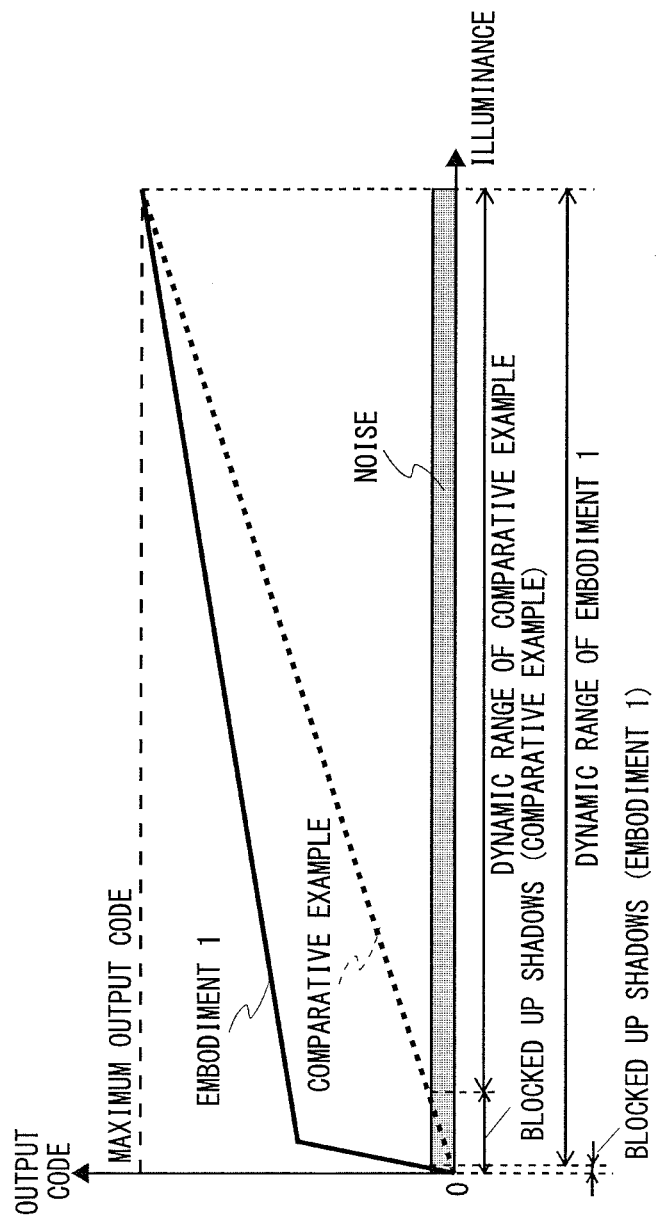
FIG. 10 is a graph illustrating a comparison between the semiconductor device according to Embodiment 1 and a semiconductor device according to the comparative example.

Now, the dynamic range of the semiconductor device according to Embodiment 1 will be described. FIG. 10 depicts a graph illustrating a comparison of the dynamic range between the semiconductor device according to Embodiment 1 and the semiconductor device according to the comparative example. In the graph depicted in FIG. 10, the axis of ordinate represents the code of image information output by the analog-to-digital converter 11 (for example, output code). The axis of abscissas represents illuminance corresponding to the pixel signal. Furthermore, when the voltage level of the pixel signal corresponds an output code for a low level, the voltage level of the pixel signal is equivalent to a noise level. Thus, the output code in this part is disabled (black level).

First, in the single slope integration AD circuit, the resolution increases with decreasing gradient of the ramp signal S1. An example is considered where a resolution of 12 bits is obtained when the voltage of the ramp signal S1 changes by 1 V during a period in which 4096 ($=2^{12}$) reference clocks CLK of are generated (hereinafter referred to as a unit period). In this case, when the amount by which the ramp signal S1 changes during the unit period is 0.5 V, the resolution is 13 bits. When the amount by which the ramp signal S1 changes during the unit period is 2 V, the resolution is 11 bits.

As seen in the graph depicted in FIG. 10, in the semiconductor device 1 according to Embodiment 1, the resolution is high on a low illuminance side and low on a high illuminance side. On the other hand, the semiconductor device 1 according to the comparative example has a constant resolution over the entire range of the illuminance.

This is because, in the semiconductor device 1 according to Embodiment 1, the gradient of the ramp signal S1 is changed between the first gradient period TD1 and the second gradient period TD2 during the sweep period in which the voltage of the ramp signal S1 is changed. More specifically, in Embodiment 1, the change takes place in a direction in which the voltage level of the ramp signal S1 lowers. Thus, in the semiconductor device 1 according to Embodiment 1, during the sweep period, the output code on the low illuminance side is generated during the first gradient period TD1, and the output code on the high illuminance side is generated during the second gradient period TD2. Then, in the semiconductor device 1 according to Embodiment 1, the gradient in the first gradient period TD 1 is set gentler than the gradient in the second gradient period TD2. Consequently, the semiconductor device 1 according to Embodiment 1 enables an increase in the resolution on the low illuminance side and a reduction in the resolution on the high resolution side.

On the other hand, in the semiconductor device according to the comparative example where the ramp signal depicted in FIG. 9 is generated, the gradient of the ramp signal is not changed during the period in which the voltage of the ramp signal is changed. Thus, the resolution remains constant over the entire range of the illuminance.

In the semiconductor device according to the comparative example, when the gradient of the resolution is set such that the maximum output code is provided at the maximum illuminance, then within a certain range of illuminance, blocked up shadows occur on the low illuminance side, as depicted in FIG. 10. On the other hand, in the semiconductor device 1 according to Embodiment 1, setting a high resolution on the low illuminance side enables the region of illuminance with possible blocked up shadows to be made smaller than in the comparative example. Furthermore, in the semiconductor device 1 according to Embodiment 1, setting the resolution on the high illuminance side lower than the resolution on the low illuminance side provides the maximum output code at the maximum illuminance. As depicted in FIG. 10, the semiconductor device 1 according to Embodiment 1 makes the region of illuminance with possible blocked up shadows smaller than in the comparative example to provide a larger dynamic range than in the comparative example.

As described above, the semiconductor device 1 according to Embodiment 1 has the pixel area 10, the analog-to-digital converter 11 that converts pixel signals read from the pixel area 10 into digital data in accordance with the ramp signal S1, and the control unit 12 that supplies the ramp signal S1 to the analog-to-digital converter 11. The ramp signal S1 has a plurality of gradients, and the plurality of gradients of the ramp signal S1 is defined by the setting values in the corresponding plurality of gradient setting registers (for example, the gradient initialization register 24, the first gradient setting register 25, and the second gradient setting register 26). In the semiconductor device 1 according to Embodiment 1, the plurality of gradients of the ramp signal S1 is changed in accordance with the pulse generation timings of the corresponding plurality of gradient change trigger signals (for example, the first change trigger signal and the second change trigger signal). Furthermore, the pulses of the plurality of gradient change trigger signals are output at timings defined in accordance with the values in the corresponding plurality of gradient change timing registers (for example, the first gradient change timing register 22 and the second gradient change timing register 23).

More specifically, in the semiconductor device 1 according to Embodiment 1, the ramp signal generating circuit 13 that provides the ramp signal S1 to the analog-to-digital converter 11 has the ramp waveform control unit 20. The ramp signal generating circuit 13 allows the gradient to be switched during the sweep period of the ramp signal S1 by using the setting values stored in the registers in the ramp waveform control unit 20 and by switching the setting values. Thus, the semiconductor device 1 according to Embodiment 1 allows the resolution of the analog-to-digital converter 11 to be switched between the low illuminance side and the high illuminance side. Then, the semiconductor device 1 according to Embodiment 1 enables a reduction in the range of illuminance with possible blocked up shadows to enlarge the dynamic range of image information. In view of the above description, the first gradient setting value stored in the ramp waveform control unit 20 may be considered to be a low illuminance-side resolution setting value, and the second gradient setting value stored in the ramp waveform control unit 20 may be considered to be a high illuminance-side resolution setting value.

Furthermore, semiconductor device 1 according to Embodiment 1 achieves enlargement of the dynamic range by changing the gradient of the ramp signal S1. For example, when the low illuminance-side resolution is improved and the maximum output code is increased in accordance with the resolution on the low illuminance side, in order to enlarge the dynamic range, a circuit corresponding to redundant bits needs to be added to the analog-to-digital converter 11 in order to achieve a high resolution. However, the semiconductor device 1 according to Embodiment 1 need not particularly change the analog-to-digital converter 11. Therefore, the semiconductor device 1 according to Embodiment 1 enables a reduction in circuit scale with respect to the magnitude of the dynamic range.

Furthermore, in the semiconductor device 1 according to Embodiment 1, the ramp signal generating circuit 13 has the integration circuit 34 and the current digital-analog conversion circuit 32 that outputs the output current applied to the integration circuit 34. Thus, the semiconductor device 1 according to Embodiment 1 allows the linearity of the ramp signal S1 to be enhanced. The enhanced linearity of the ramp signal S1 allows the result of conversion by the analog-to-digital converter 11 to be made more linear than in a case where the ramp signal S1 is changed step by step.

Additionally, in the semiconductor device 1 according to Embodiment 1, the k-bit and n-bit setting values are stored in the registers in the ramp waveform control unit 20 to allow the gradient change timing for the ramp signal and the gradient of the ramp signal to be changed in accordance with the setting values. Thus, the semiconductor device 1 according to Embodiment 1 is characterized by high reproducibility of the ramp signal.

In addition, in the semiconductor device 1 according to Embodiment 1, the current value of the offset current, the gradient change timing, and the set level of the gradient of the ramp signal S1 can be set in accordance with the number of bits stored in the registers in the ramp waveform control unit 20. For example, the gradient of the ramp signal S1 can be set in $2^n$ steps because the gradient setting value has n bits. Thus, the semiconductor device 1 according to Embodiment 1 allows the gradient of the ramp signal S1 and the change timing for the gradient to be set in detail to enable an increase in the degree of enlargement of the dynamic range.

Furthermore, in the semiconductor device 1 according to Embodiment 1, various setting values are stored in the registers in the ramp waveform control unit 20. The setting values can be rewritten by, for example, a higher system or an external system such as a camera control circuit. The property of the pixels arranged in the pixel area 10, for example, the noise property, is changed by a change in temperature condition. Thus, the waveform setting value for the ramp signal S1 is stored in the register and adjusted in accordance with a change in condition, for example, a change in temperature condition, to enable adjustment needed to provide a constantly optimum ramp signal S1. Furthermore, a variation among the pixels arranged in the pixel area 10 can be dealt with by adjusting the ramp signal S1.

Additionally, in the semiconductor device 1 according to Embodiment 1, for the variable range of the output current from the current digital-analog conversion circuit 32, the mirror ratio of the current mirror circuit is set such that the output current can be varied in $2^n$ steps within a given range of changes. The integration circuit 34 integrates the output current to output the ramp signal S1. This configuration enables the semiconductor device 1 according to Embodiment 1 to adjust the gradient of the ramp signal S1 in $2^n$ steps within a given range of gradients, allowing the resolution to be set in detail.

In addition, the semiconductor device 1 according to Embodiment 1 allows the length of the initial gradient period TDD during the sweep period to be set using the first gradient change timing value and allows the gradient of the ramp signal S1 during the initial gradient period TDD to be set using the initial gradient setting value. The semiconductor device 1 according to Embodiment 1 also has the offset current source 31 to allow setting of the voltage level of the ramp signal S1 at the beginning of the initial gradient period TDD. Thus, the semiconductor device 1 according to Embodiment 1 allows enlargement of the gradient setting range for the ramp signal S1 during the first gradient period TD1 and the second gradient period TD2 with respect to the limited range of changes in the ramp signal S1. In the semiconductor device 1 according to Embodiment 1, the gradient change timing is set using the gradient change timing value stored in the gradient change timing register. However, the semiconductor device 1 according to Embodiment 1 may be configured such that the gradient is changed by a gradient change pulse received through an external terminal.

Furthermore, in the semiconductor device 1 according to Embodiment 1, the first gradient setting value is preferably set smaller than the second gradient setting value. In other words, the gradient of the ramp signal S1 during the first gradient period TD1 is preferably set smaller than the gradient of the ramp signal S1 during the second gradient period TD2. This is because such setting enables a reduction in the range of illuminance within which blocked up shadows occur on the low illuminance side.

In many usage examples where an image sensor for in-vehicle applications or surveillance camera applications is used to acquire an image of a dark environment including a bright portion. Even in such a case, objects need to be definitely recognized throughout the image, and in particular, the resolution on the low illuminance side needs to be improved. Thus, enlargement of such a dynamic range is particularly effective for in-vehicle applications and surveillance camera applications.

Additionally, when the frame rate of the image to be acquired is to be increased, this needs to be addressed by, for example, reducing the resolution of the analog-digital converting process. However, in the semiconductor device 1 according to Embodiment 1, even when the overall resolution of the analog-digital converting process is kept constant, images with blown out highlights or blocked up shadows can be acquired by partially switching the resolution in accordance with the illuminance. In other words, the semiconductor device 1 according to Embodiment 1 enables an increase in the frame rate for image acquisition while preventing blown out highlights or blocked up shadows. Particularly for in-vehicle applications, in a vehicle body traveling at high speed, surrounding images need to be acquired at high resolution, and thus, acquiring images using a high frame rate and a wide dynamic range has a profound significance.

In addition, when the semiconductor device 1 according to Embodiment 1 is used, the following method for generating image data is executed. The method for generating image data in the semiconductor device 1 according to Embodiment 1 is a image data generating method for converting pixel signals from an image sensor into digital data, the method including (a) sweeping a ramp signal at an initial gradient, (b) changing the gradient of sweep of the ramp signal to a first gradient in accordance with a value in a gradient change register upon receiving a gradient change pulse, and (c) comparing a voltage of the ramp signal with a voltage of each of the pixel signals to convert the analog voltage of the pixel signal into a digital value. The first gradient is selected from $2^n$ values for the bit width n of the gradient change register. When image data is generated using such a method, the image data can be generated using a wide dynamic range in spite of a small circuit area.

A camera system using the semiconductor device according to Embodiment 1 is a camera system having a lens, an image sensor that converts an image received via the lens into a digital signal and an output circuit that outputs the digital signal to external transmission means. The image sensor has a pixel area 10 and an analog-to-digital converter 11 that converts pixel signals read from the pixel area 10 into digital data in accordance with a ramp signal S1. The ramp signal S1 has first and second gradients set in accordance with values in first and second gradient setting registers, respectively. The second gradient is larger than the first gradient. Thus, the camera system according to Embodiment 1 allows imaging data with a wide dynamic range to be acquired using a semiconductor device with a small circuit area.

Embodiment 2

Figure 11:
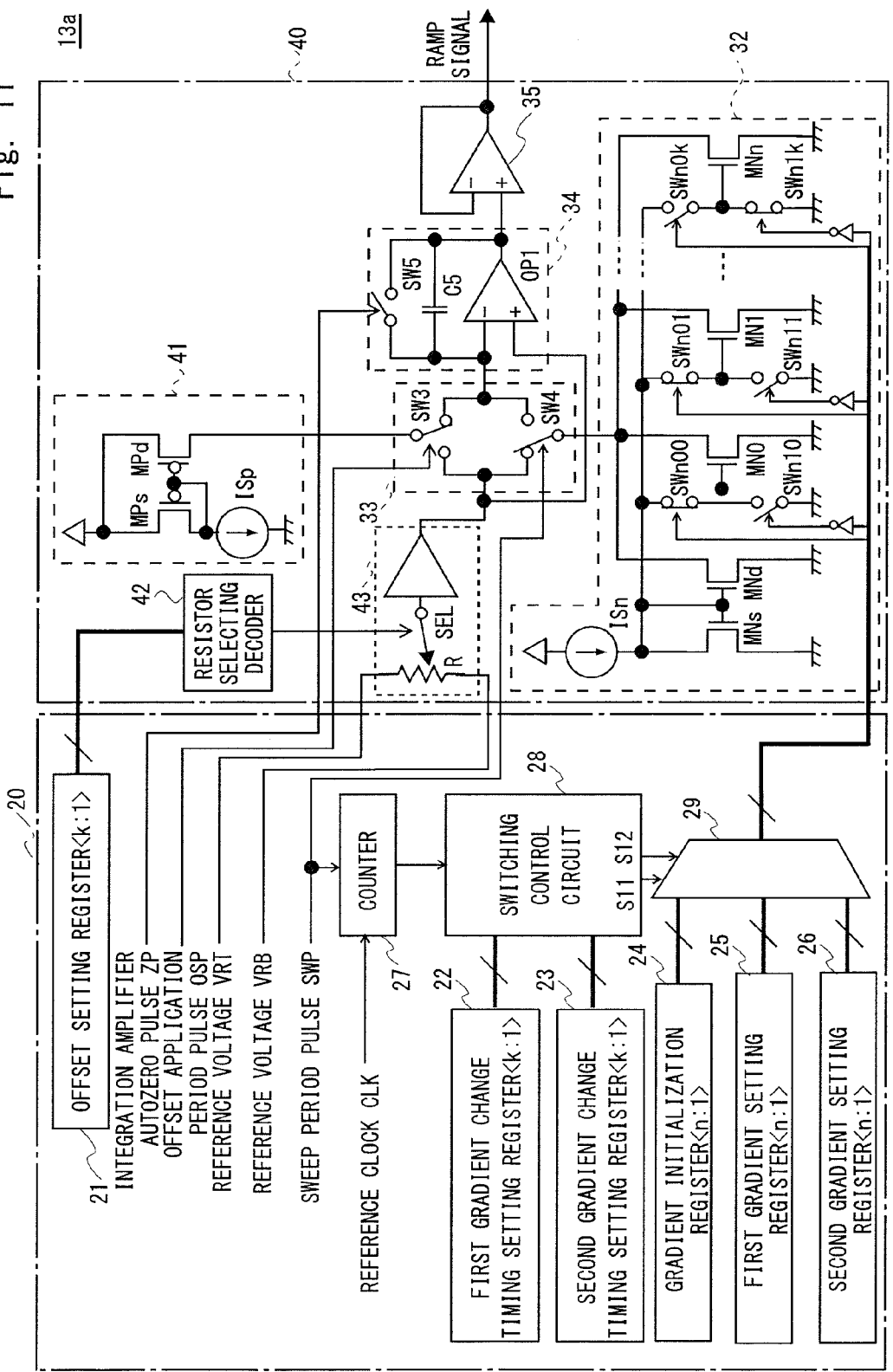
FIG. 11 is a block diagram of a ramp signal generating circuit in a semiconductor device according to Embodiment 2.

In Embodiment 2, a ramp signal generating circuit 13a that is another form of the ramp signal generating circuit 13 will be described. FIG. 11 is a block diagram of the ramp signal generating circuit 13a according to Embodiment 2. In the description of Embodiment 2, components described in Embodiment 1 are denoted by the same reference numerals as those in Embodiment 1 and will not be described below.

As depicted in FIG. 11, the ramp signal generating circuit 13a has a ramp waveform generating circuit 40 instead of the ramp waveform generating circuit 30. The ramp waveform generating circuit 40 includes an offset current source 41 replacing an offset current source 31 and additionally includes a resistor selecting decoder 42 and a reference voltage generating circuit 43. Furthermore, in the ramp signal generating circuit 13a according to Embodiment 1, a reference voltage setting value used to set a value for a reference voltage to be provided to an integration circuit is stored in the offset setting register 21.

The offset current source 41 has PMOS transistors MPs and MPd of the offset current source 31 and a current source ISp. In other words, the offset current source 41 outputs an offset current with a predetermined current value.

The resistor selecting decoder 42 decodes the reference voltage setting value stored in the offset setting register 21 and outputs a resistor select signal. The reference voltage generating circuit 43 has a resistor R, a selector SEL, and a buffer circuit. A reference signal VRT generated by a reference voltage generating circuit 14 is applied to a first end of the resistor R. A reference signal VRB generated by the reference voltage generating circuit 14 is applied to a second end of the resistor R. The resistor R is provided with a plurality of taps. Each of the taps outputs a candidate reference voltage according to the resistor ratio of the resistor value of the resistor arranged on the reference voltage VRT side with respect to the tap and the resistor value of the resistor arranged on the reference voltage VRB side with respect to the tap. The selector SEL selects one of the taps of the resistor R in accordance with a resistor select signal output by the resistor selecting decoder 42, and transmits the candidate reference voltage output from the selected tap to the buffer circuit. The buffer circuit outputs the candidate reference voltage provided by the selector SEL, as a reference voltage. The reference voltage is provided to a non-inverted input terminal of an amplifier OP1 an integration circuit 34.

Now, operations of the ramp waveform generating circuit 40 will be described. The ramp waveform generating circuit 40 differs from the ramp waveform generating circuit in Embodiment 1 in an operation during an offset application period starting at timing T2 in FIG. 8 (the period in which an offset application period pulse OSP is at the high level). More specifically, in the ramp waveform generating circuit 40, the reference voltage provided to the integration circuit 34 is set in accordance with the reference voltage setting value stored in the offset setting register 21. During the offset application period, an offset current with a given current amount is applied to the integration circuit 34 for a given period. In other words, the ramp waveform generating circuit 40 sets the voltage value for the ramp signal S1 at the beginning of an initial gradient period TDD for a ramp signal S1 by keeping a change in the voltage of the ramp signal S1 constant during the offset application period and varying a voltage used as a reference for the ramp signal S1.

In Embodiment 2, another example of the circuit allowing the offset amount of the ramp signal S1 to be set has been illustrated. As described above, various examples of the circuit allowing the offset amount of the ramp signal S1 to be set are available. Any of these circuits may be selected in accordance with a circuit area and a demanded specification.

Embodiment 3

In Embodiment 3, an example will be described where the dynamic range of image information is further enlarged by double exposure. In the description of Embodiment 3, components described in Embodiment 1 are denoted by the same reference numerals as those in Embodiment 1 and will not be described below.

Figure 12:
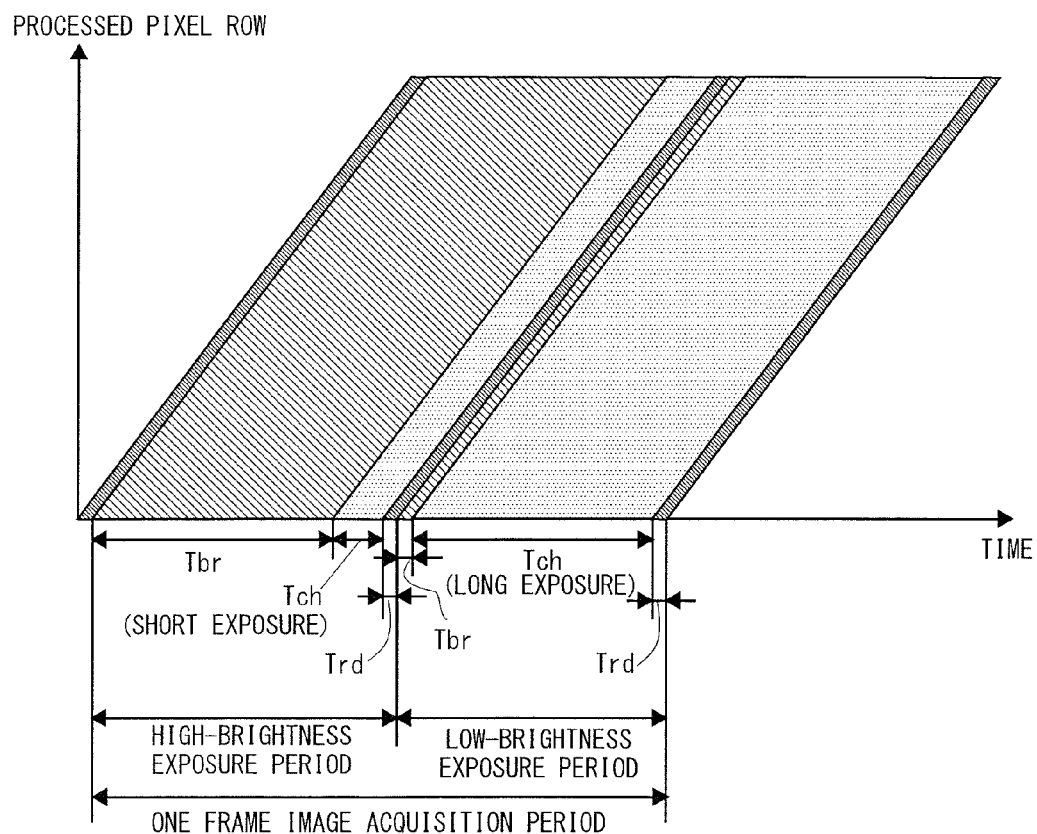
FIG. 12 is a timing chart illustrating acquisition of pixel signals in a semiconductor device according to Embodiment 3.

FIG. 12 depicts a timing chart illustrating acquisition of pixel signals in a semiconductor device according to Embodiment 3. As depicted in FIG. 12, if a double exposure scheme is adopted, two pixel signals are obtained during respective two periods, that is, a high-brightness exposure period and a low-brightness exposure period when one frame of image is acquired. During the high-brightness exposure period, much incident light is incident via a lens. On the other hand, during the low-brightness exposure period, the amount of light input via the lens is smaller than during the high-brightness exposure period. Furthermore, in the double exposure scheme, both the high-brightness exposure period and the low-brightness exposure period have a blanking period Tbr, an exposure period Tch, and a read period Trd. In this regard, the exposure period Tch during the high-brightness exposure period is shorter than the exposure period Tch during the low-brightness exposure period. Two images with different brightnesses are synthesized in a camera system to acquire a dynamic-range image.

Figure 13:
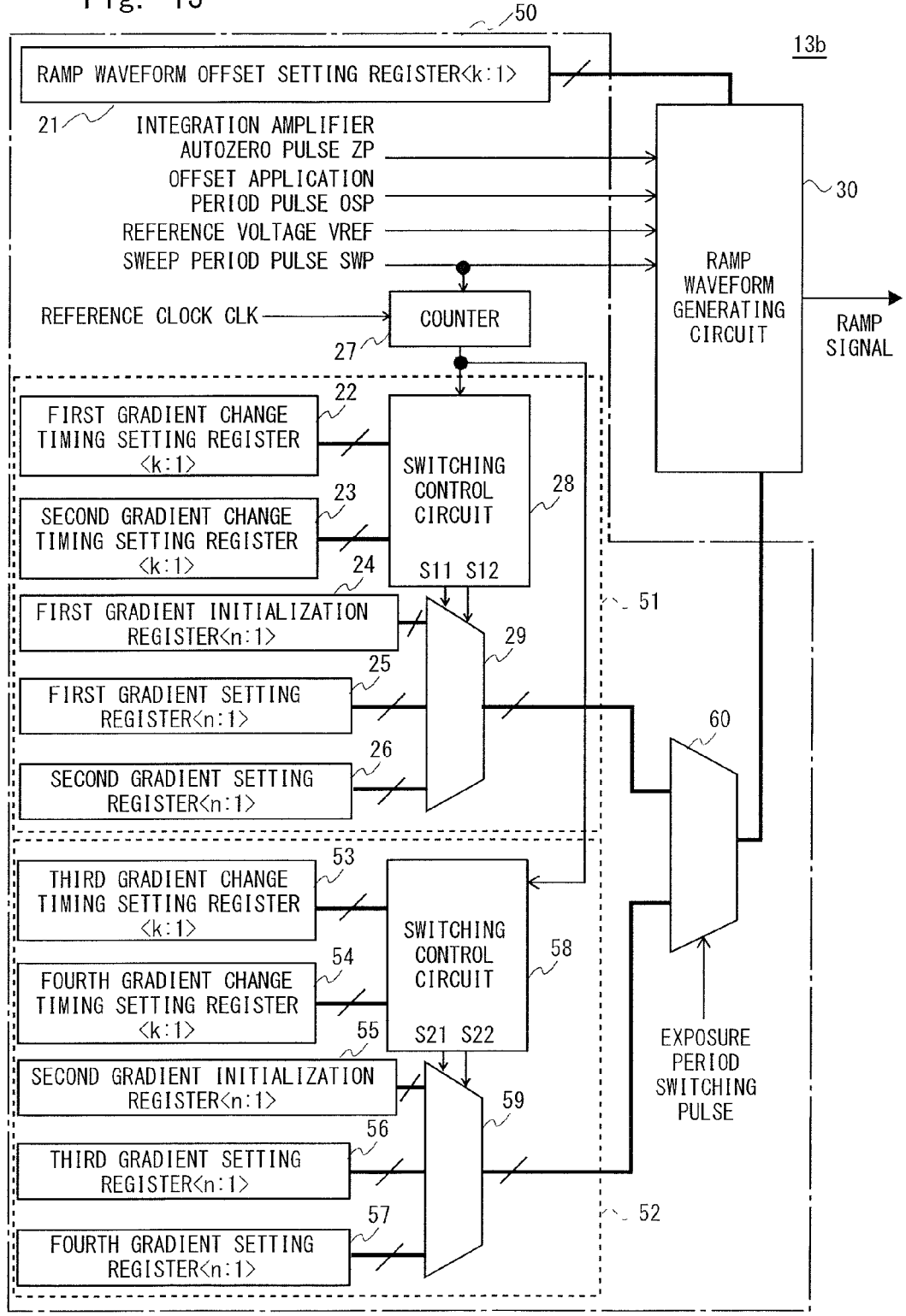
FIG. 13 is a block diagram of a ramp signal generating circuit in a semiconductor device according to Embodiment 3.

A semiconductor device that deals with the double exposure scheme can achieve this scheme by replacing the ramp signal generating circuit 13 according to Embodiment 1 with a ramp signal generating circuit 13b. FIG. 13 depicts a block diagram of the ramp signal generating circuit 13b according to Embodiment 3. As depicted in FIG. 13, the ramp signal generating circuit 13b corresponds to the ramp signal generating circuit 13 in which the ramp waveform control unit 20 is replaced with a ramp waveform control unit 50.

The ramp waveform control unit 50 has two gradient setting units each with a gradient initialization register, a first gradient setting register, a second gradient setting register, a first gradient change timing setting register, a second gradient change timing setting register, and a selector. The ramp signal generating circuit 13b depicted in FIG. 13 has a gradient setting unit 51 and a gradient setting unit 52. For example, the gradient setting unit 51 stores a gradient setting value and the like which are applied during the high-brightness exposure period. The gradient setting unit 52 stores a gradient setting value and the like which are applied during the low-brightness exposure period. Furthermore, the ramp signal generating circuit 13b has a setting switching unit 60 that performs selection from setting values output from the two gradient setting units.

More specifically, the gradient setting unit 51 has a first gradient change timing register 22, a second gradient change timing register 23, a first gradient initialization register 24, a first gradient setting register 25, a second gradient setting register 26, a switching control circuit 28, and a selector 29. Furthermore, the gradient setting unit 52 has a third gradient change timing register 53, a fourth gradient change timing register 54, a second gradient initialization register 55, a third gradient setting register 56, a fourth gradient setting register 57, a switching control circuit 58, and a selector 59.

The first gradient initialization register 24 is the same as the gradient initialization register 24, but has the name has been changed to allow the first gradient initialization register 24 to be distinguished from the gradient initialization register 55 in the gradient setting unit 52. The third gradient change timing register 53, the fourth gradient change timing register 54, the second gradient initialization register 55, the third gradient setting register 56, and the fourth gradient setting register 57 are the same as the first gradient change timing register 22, the second gradient change timing register 23, the gradient initialization register 24, the first gradient setting register 25, and the second gradient setting register 26 except for stored setting values. The switching control circuit 58 and the selector 59 are the same as the switching control circuit 28 and the selector 29. A counter 27 is shared by the gradient setting unit 51 and the gradient setting unit 52.

In the semiconductor device according to Embodiment 3 to which the ramp signal generating circuit 13b is applied, the ramp signal S1 has different waveforms between the high-brightness exposure period and the low-brightness exposure period. Now, a variation in the waveform of a ramp signal S1 according to the exposure period will be described. FIG. 14 depicts a timing chart depicting changes in the ramp signal in the semiconductor device according to Embodiment 3.

As depicted in FIG. 14, in Embodiment 3, the gradient of the ramp signal S1 during the low-brightness exposure period is set to be gentle compared to the gradient of the ramp signal S1 during the high-brightness exposure period. This can be achieved because the semiconductor device according to Embodiment 3 allows the applied gradient setting unit to be switched for every exposure period. Furthermore, in Embodiment 3, the range of changes in the voltage of the ramp signal S1 is set to be the same for the two exposure periods. This is because the ramp signal S1 needs a change in voltage equivalent to the maximum output code for charge information obtained during one exposure.

Furthermore, an initial gradient period TDD1, a first gradient period TD1, and a second gradient period TD2 during the high-brightness exposure period are set in accordance with timing values stored in the first gradient change timing register 22 and the second gradient change timing register 23, respectively. Additionally, the gradient of the ramp signal S1 during the initial gradient period TDD1 is set in accordance with an initial gradient setting value stored in the first gradient initialization register 24. The gradient of the ramp signal S1 during the first gradient period TD1 is set in accordance with a first gradient setting value stored in the first gradient setting register 25. The gradient of the ramp signal S1 during the second gradient period TD2 is set in accordance with a second gradient setting value stored in the second gradient setting register 26.

Furthermore, an initial gradient period TDD2, a third gradient period TD3, and a fourth gradient period TD4 during the low-brightness exposure period are set in accordance with timing values stored in the third gradient change timing register 53 and the fourth gradient change timing register 54, respectively. Additionally, the gradient of the ramp signal S1 during the initial gradient period TDD2 is set in accordance with an initial gradient setting value stored in the second gradient initialization register 55. The gradient of the ramp signal S1 during the third gradient period TD3 is set in accordance with a third gradient setting value stored in the third gradient setting register 56. The gradient of the ramp signal S1 during the fourth gradient period TD4 is set in accordance with a fourth gradient setting value stored in the fourth gradient setting register 57.

Figure 15:
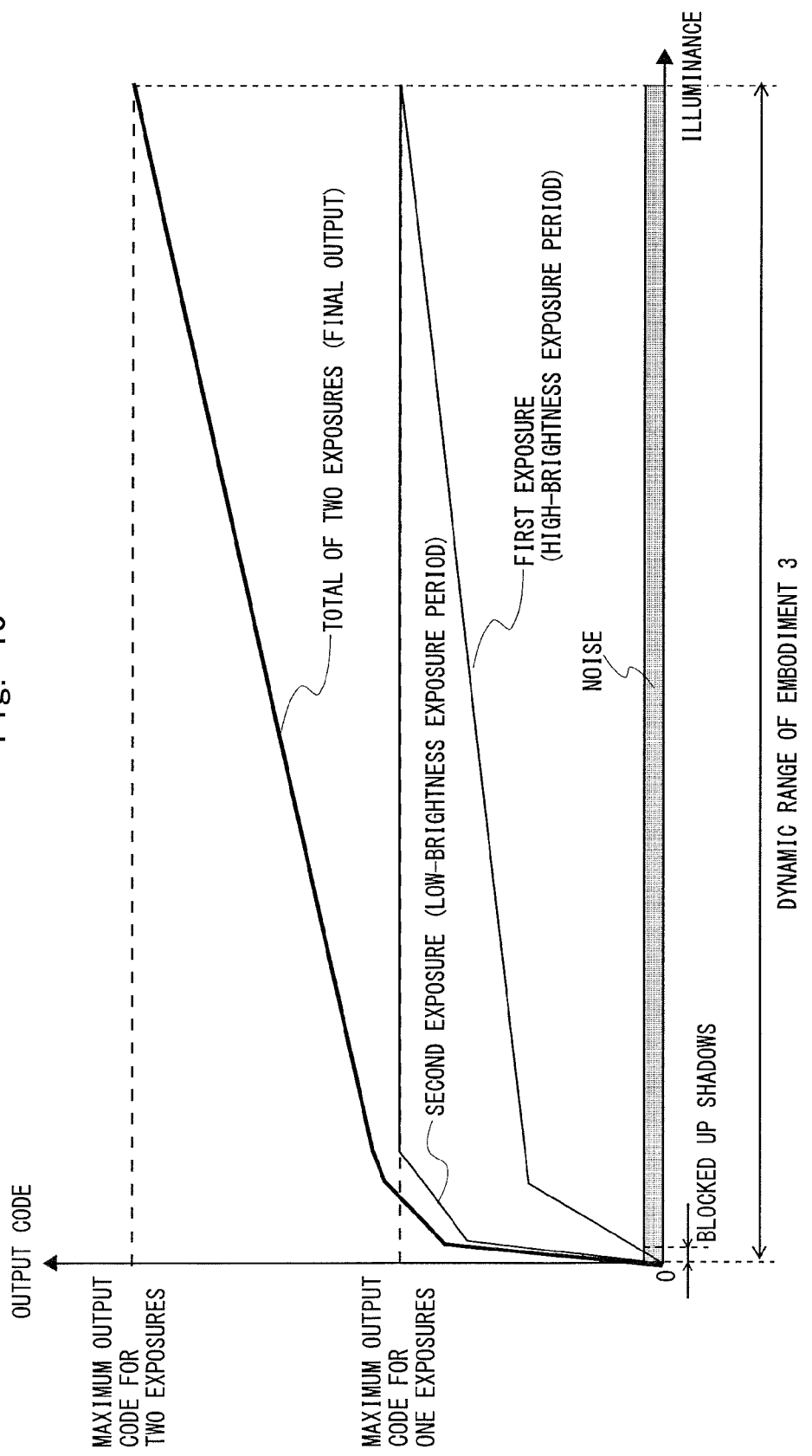
FIG. 15 is a graph illustrating the dynamic range of the semiconductor device according to Embodiment 3.

Now, the dynamic range of the semiconductor device according to Embodiment 3 will be described. FIG. 15 depicts a graph illustrating the dynamic range of the semiconductor device according to Embodiment 3. As depicted in FIG. 15, for the first time, pixel signals are acquired during the high-brightness exposure period (short exposure). For the second time, pixel signals are acquired during the low-brightness exposure period (long exposure). In FIG. 15, a graph for the final output resulting from synthesis of image information obtained through two exposures is depicted by a thick line.

As depicted in FIG. 15, in the semiconductor device according to Embodiment 3, such analog-digital conversion as sets a high resolution for a low-illuminance side and a low illuminance for a high illuminance side is performed on all pixel signals acquired during the two exposure periods. Furthermore, the analog-digital conversion is performed so as to set a lower resolution for pixel signals obtained during the low-brightness exposure period than for pixel signals obtained during the high-brightness exposure period.

In this regard, the semiconductor device according to Embodiment 3 allows the set level of the gradient of the ramp signal S1 to be set in detail, digital values can be output for pixel signals with high illuminance obtained during the high-brightness exposure period, without causing blown out highlights (a state where the graph stays at the maximum output code for one exposure). Furthermore, digital values can be output for pixel signals with low illuminance obtained during the low-brightness exposure period, with the range of blocked up shadows (a state where the graph is equal to the noise level) minimized. Moreover, for the image information generated by the semiconductor device according to Embodiment 3, a possible state is prevented where one image in the image information obtained through two exposures is subjected to blown out highlights, whereas the other image is subjected to blocked up shadows.

Figure 16:
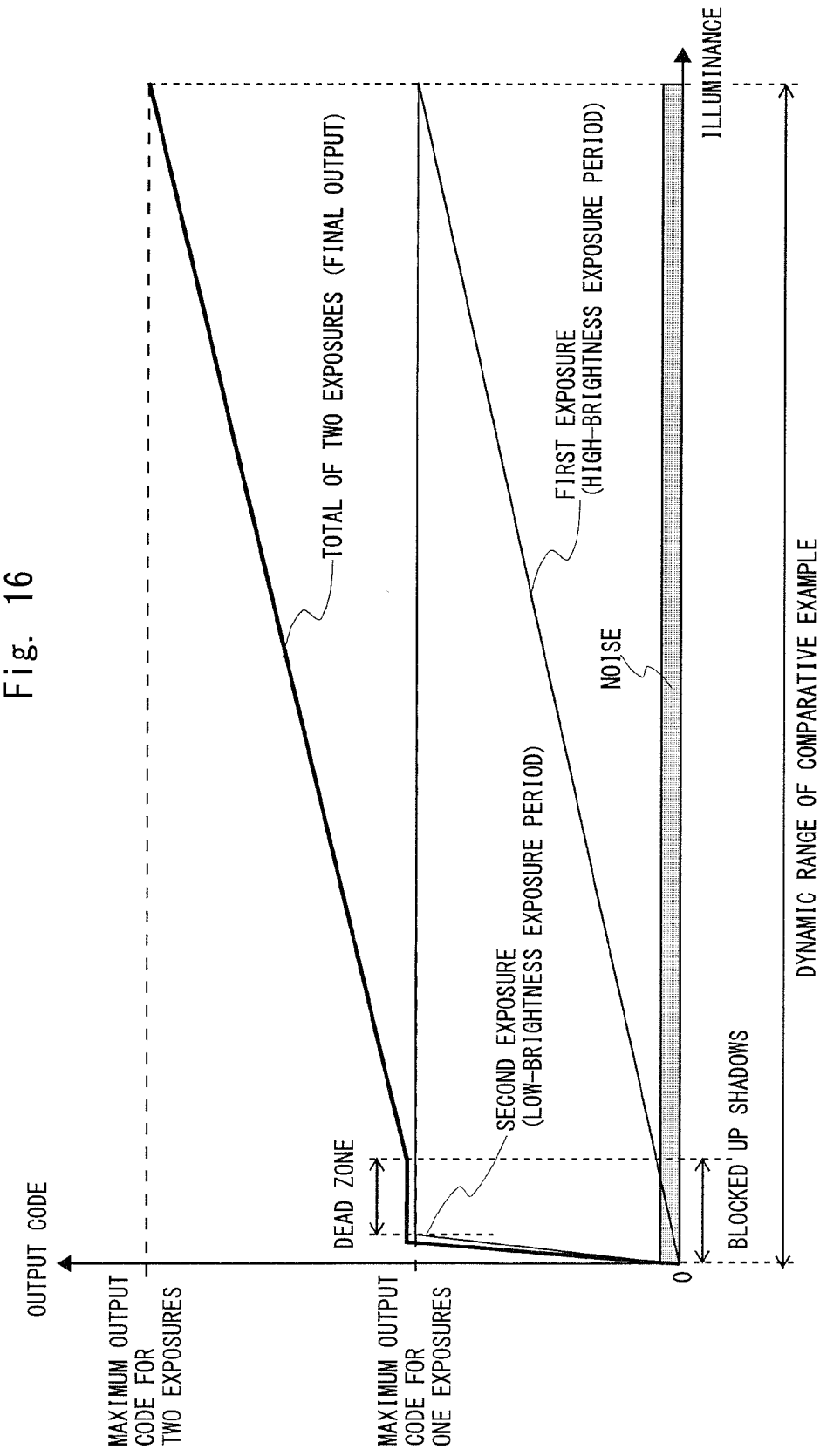
FIG. 16 is a graph illustrating the dynamic range of a semiconductor device according to a comparative example.

The dynamic range of image information output by a semiconductor device will be described as a comparative example, the semiconductor device being capable of changing the gradient of the ramp signal between the two exposure periods but failing to change the gradient of the ramp signal during the sweep period. FIG. 16 depicts a graph illustrating the dynamic range of the semiconductor device according to the comparative example.

As depicted in FIG. 16, the semiconductor device according to the comparative example enables the resolution of the analog-digital conversion to be switched between two pieces of information obtained during the respective exposure periods. However, since the semiconductor device according to the comparative example fails to change the gradient of the ramp signal during the sweep period, blocked up shadows may occur over a wide range in the image information obtained during the high-brightness exposure period. Furthermore, narrowing the range of blocked up shadows in the image information obtained during the low-brightness exposure period reduces the range of brightness that can be converted into digital values without causing blown up highlights. Additionally, in the comparative example, a state occurs where one image is subjected to blown out highlights, whereas the other image is subjected to blocked up shadows, as depicted in FIG. 16. Within the range in which such a state occurs, the image information is filled with a gray color, which is an intermediate level between the blocked up shadows and the blown up highlights after HDR synthesis. This range is hereinafter referred to as a dead zone.

As described above, the semiconductor device according to Embodiment 3 enables the gradient of the ramp signal S1 to be set for each of the high- and low-brightness exposure periods. The semiconductor device according to Embodiment 3 also enables the gradient of the ramp signal S1 to be switched during the sweep period in each of the two exposure periods. Moreover, the semiconductor device according to Embodiment 3 allows the degree of freedom of the setting value of the ramp signal S1 to be made as high as the degree of freedom in the semiconductor device 1 according to Embodiment 1. Consequently, image information can be output which has a narrowed range of illuminance within which blocked up shadows and blown up highlights occur during the two periods, and thus, image information with a wide dynamic range can be output without causing a dead zone.

Furthermore, the double exposure scheme provides an output code indicating an image with a double range of illuminance, compared to a single exposure scheme. When an image with a wide dynamic range and with no dead zone is acquired, object recognition using the image acquired can be achieved more accurately than in the related art.

Additionally, the double exposure scheme tends to need a longer time to obtain the final output because two exposure periods are needed to acquire one frame of image. On the other hand, the semiconductor device according to Embodiment 3 allows an image with a reduced range of illuminance with possible blocked up shadows or blown up highlights to be acquired without an increase in the time for the analog-digital conversion performed on pixel signals, as described in Embodiment 1. Thus, by applying the semiconductor device according to Embodiment 3 to a camera system based on the double exposure scheme, the frame rate of the system can be increased.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a pixel area in which charge according to the amount of incident light is accumulated and which outputs pixel signals;
   an analog-to-digital converter that reads the pixel signals and outputs digital values each according to the magnitude of a corresponding one of the pixel signals using a ramp signal; and
   a ramp signal generating circuit that outputs the ramp signal,
   wherein the ramp signal generating circuit includes:
   a gradient initialization register that stores an initial gradient setting value indicating a gradient of the ramp signal during an initial gradient period in a preset sweep period;
   a first gradient setting register that stores a first gradient setting value indicating the gradient of the ramp signal during a first gradient period following the initial gradient period in the sweep period;
   a second gradient setting register that stores a second gradient setting value indicating the gradient of the ramp signal during a second gradient period following the first gradient period in the sweep period;
   a first gradient change timing setting register that stores a first change timing value indicating a timing for a change from the initial gradient period to the first gradient period;
   a second gradient change timing setting register that stores a second change timing value indicating a timing for a change from the first gradient period to the second gradient period;
   a counter that counts reference clocks received during the sweep period and outputs a count value;
   a switching control circuit that compares the count value with the first change timing value and compares the count value with the second change timing value to output a select signal;
   a selector that outputs one of the initial gradient value, the first gradient setting value, and the second gradient setting value in accordance with the select signal; and
   a ramp waveform generating circuit that outputs the ramp signal that changes linearly at a gradient according to the value output by the selector,
   wherein the ramp waveform generating circuit comprises:
   a current digital-analog conversion circuit that outputs an output current of a magnitude according to the value output by the selector, wherein the current digital-analog conversion circuit comprises a current mirror having a source side transistor connected to a current source and a plurality of branch-side transistors that outputs the output current, and the plurality of branch-side transistors is provided in association with the initial gradient value, the first gradient setting value and the second gradient setting value.

2. The semiconductor device according to claim 1, wherein the ramp waveform generating circuit comprises:
   an integration circuit that integrates the output current to output the ramp signal.

3. The semiconductor device according to claim 2, wherein
   the initial gradient value, the first gradient setting value, and the second gradient setting value are each an n-bit value, and the current digital-analog conversion circuit varies a current value for the output current in 2n steps within a given range of changes in output current.

4. The semiconductor device according to claim 2, wherein connection between the source-side transistor and gates of the plurality of branch-side transistors is switched in accordance with the initial gradient value, the first gradient setting value, and the second gradient setting value.

5. The semiconductor device according to claim 2, wherein the ramp signal generating circuit includes:
an offset setting register that stores an offset setting value for setting a voltage value for an initial ramp signal during the initial gradient period; and
an offset current source that outputs an offset current to the integration circuit in accordance with the offset setting value.

6. The semiconductor device according to claim 2, wherein the ramp signal generating circuit includes:
an offset setting register that stores a reference voltage setting value for setting a value for a reference voltage provided to the integration circuit; and
a reference voltage generating circuit that varies the reference voltage in accordance with the reference voltage setting value.

7. The semiconductor device according to claim 1, further comprising a plurality of gradient setting units including the gradient initialization register, the first gradient setting register, the second gradient setting register, the first gradient change timing setting register, the second gradient change timing setting register, and the selector; and
at least one processor configured to execute a setting switching unit that switches an output of one of the plurality of gradient setting units for pixel signals acquired in the pixel area during different exposure times.

8. The semiconductor device according to claim 1, wherein the first gradient setting value is smaller than the second gradient setting value.

9. A ramp signal control method for a semiconductor device that includes a pixel area in which charge according to the amount of incident light is accumulated and which outputs pixel signals, an analog-to-digital converter that reads the pixel signals and outputs digital values each according to the magnitude of a corresponding one of the pixel signals using a ramp signal, and a ramp signal generating circuit that outputs the ramp signal,
the ramp signal generating circuit including a gradient initialization register, a first gradient setting register, a second gradient setting register, a first gradient change timing setting register, a second gradient change timing setting register, and a ramp waveform generating circuit that outputs the ramp signal that changes linearly, the method comprising:
changing the ramp signal at a gradient according to an initial gradient setting value stored in the gradient initialization register during a period from a beginning of a sweep period in which the ramp signal is changed until a first change timing value stored in the first gradient change timing setting register is reached;
changing the ramp signal at a gradient according to the first gradient setting value stored in the first gradient change timing setting register during a period from the beginning of the sweep period until a second change timing value stored in the second gradient change timing setting register is reached; and
changing the ramp signal at a gradient according to the second gradient setting value stored in the second gradient change timing setting register after a time from the beginning of the sweep period reaches the second change timing value,
wherein the changing the ramp signal includes:
switching a current value by a current mirror having a source side transistor connected to a current source and a plurality of branch-side transistors that outputs an output current, and the plurality of branch-side transistors is provided in association with the initial gradient value, the first gradient setting value and the second gradient setting value.

10. The ramp signal control method according to claim 9 wherein
the ramp waveform generating circuit includes an integration circuit that integrates the output current output by the current source to output the ramp signal.

11. The ramp signal control method according to claim 10, wherein the initial gradient value, the first gradient setting value, and the second gradient setting value are each a multi-bit value, and the current source varies the current value for the output current in 2n steps within a given range of changes in output current.

12. The ramp signal control method according to claim 9, wherein the semiconductor device further includes a plurality of gradient setting units including the gradient initialization register, the first gradient setting register, the second gradient setting register, the first gradient change timing setting register and the second gradient change timing setting register; and
a setting switching unit that switches an output of one of the plurality of gradient setting units for pixel signals acquired in the pixel area during different exposure times.

13. The ramp signal control method according to claim 9, wherein the first gradient setting value is smaller than the second gradient setting value.

14. The ramp signal control method according to claim 9, wherein the ramp signal generating circuit includes an offset setting register that sets a voltage value for an initial ramp signal during the initial gradient period, and sets a voltage value for the ramp signal with an initial value during the sweep period in accordance with an offset value stored in the offset setting register.

15. A semiconductor device comprising a pixel area, an analog-to-digital converter that converts pixel signals read from the pixel area into digital data in accordance with a ramp signal, and at least one processor configured to execute a control unit that supplies the ramp signal to the analog-to-digital converter,
wherein the ramp signal has a plurality of gradients, and the plurality of gradients is defined by setting values in a plurality of corresponding gradient setting registers, including an initial gradient value, a first gradient setting value and a second gradient setting value,
wherein the ramp signal is changed by switching a current value by a current mirror having a source side transistor connected to a current source and a plurality of branch-side transistors that outputs an output current, and the plurality of branch-side transistors is provided in association with the initial gradient value, the first gradient setting value and the second gradient setting value.

16. The semiconductor device according to claim 15, wherein the plurality of gradients of the ramp signal is changed in accordance with pulse generation timings of a plurality of corresponding gradient change trigger signals.

17. The semiconductor device according to claim 15, wherein pulses of the plurality of gradient change trigger signals are output at timings defined in accordance with values in a plurality of corresponding gradient change timing registers.

18. An image data generating method for converting pixel signals from an image sensor into digital data, the method comprising:
- (a) sweeping a ramp signal at an initial gradient;
- (b) changing the gradient of sweep of the ramp signal to a first gradient in accordance with a value in a gradient change register upon receiving a gradient change pulse, the gradient change register including a first gradient setting value and a second gradient setting value; and
- (c) comparing a voltage of the ramp signal with a voltage of each of the pixel signals to convert an analog voltage of the pixel signal into a digital value,
- wherein the changing the gradient of sweep of the ramp signal includes:
- switching a current value by a current mirror having a source side transistor connected to a current source and a plurality of branch-side transistors that outputs an output current, and the plurality of branch-side transistors is provided in association with the initial gradient, the first gradient setting value and the second gradient setting value.

19. The image data generating method according to claim 18, wherein the first gradient is selected from 2n values for a bit width n of the gradient change register.

20. A camera system comprising:

a lens;

an image sensor that converts an image received via the lens into a digital signal; and an output circuit that outputs the digital signal to external transmission means, wherein the image sensor includes a pixel area and an analog-to-digital converter that converts pixel signals read from the pixel area into digital data in accordance with a ramp signal, the ramp signal has first and second gradients set in accordance with values in first and second gradient setting registers, respectively, the values being a first gradient setting value and a second gradient setting value, and the second gradient is larger than the first gradient, wherein the ramp signal is changed by switching a current value by a current mirror having a source side transistor connected to a current source and a plurality of branch-side transistors that outputs an output current, and the plurality of branch-side transistors is provided in association with an initial gradient value, the first gradient and the second gradient.

\* \* \* \* \*